(12) United States Patent
Liu et al.

(10) Patent No.: US 10,819,209 B2
(45) Date of Patent: Oct. 27, 2020

(54) MULTI-SOURCE ENERGY HARVESTER SYSTEM AND POWER CONVERSION APPARATUS AND METHOD THEREOF

(71) Applicant: RICHTEK TECHNOLOGY CORPORATION, Zhubei, Hsinchu (TW)

(72) Inventors: Kuo-Chi Liu, Hsinchu (TW); Chang-Yu Ho, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 12 days.

(21) Appl. No.: 16/414,811

(22) Filed: May 17, 2019

(65) Prior Publication Data

US 2019/0386556 A1  Dec. 19, 2019

Related U.S. Application Data

(60) Provisional application No. 62/684,710, filed on Jun. 13, 2018.

(30) Foreign Application Priority Data

Dec. 21, 2018  (TW) .............................. 107146331 A

(51) Int. Cl.
| | |
|---|---|
| H02J 7/00 | (2006.01) |
| H03H 7/38 | (2006.01) |
| H02M 1/00 | (2006.01) |
| H02M 7/06 | (2006.01) |
| H02M 3/04 | (2006.01) |

(52) U.S. Cl.
CPC ................ H02M 1/00 (2013.01); H02J 7/00 (2013.01); H02M 3/04 (2013.01); H02M 7/06 (2013.01); H03H 7/38 (2013.01); *H02M 2001/0083* (2013.01)

(58) Field of Classification Search
CPC ............ H02M 1/00; H02M 3/04; H02M 7/06; H02M 2001/0083; H03H 7/38; H02J 3/38; H02J 7/35
See application file for complete search history.

(56) References Cited

U.S. PATENT DOCUMENTS

| | | | |
|---|---|---|---|
| 9,166,434 B2 * | 10/2015 | Huang | ................ H02J 2207/40 |
| 9,806,527 B1 | 10/2017 | Olah | |
| 10,424,934 B2 * | 9/2019 | Im | .............................. H02J 7/35 |
| 2014/0001849 A1 * | 1/2014 | Huang | ................ H02J 2207/40 |
| | | | 307/24 |

\* cited by examiner

*Primary Examiner* — Dinh T Le
(74) *Attorney, Agent, or Firm* — Tung & Associates

(57) ABSTRACT

A multi-source energy harvester system includes a power conversion apparatus. First and second energy harvesters respectively harvest first and second energy and respectively provide first and second input powers. The power conversion apparatus includes an adjustable impedance matching circuit and a power conversion circuit. The impedance matching circuit generates an adjusted power according to the first input power. The power conversion circuit converts a bus power to an output power. The energy harvester system controls a first and a second switch circuits according to the adjusted power and/or the second input power to select and conduct one of the adjusted power or the second input power as the bus power, and adjusts an impedance of the adjustable impedance matching circuit to maximize a voltage of the adjusted power.

28 Claims, 22 Drawing Sheets

US 10,819,209 B2

MULTI-SOURCE ENERGY HARVESTER SYSTEM AND POWER CONVERSION APPARATUS AND METHOD THEREOF

CROSS REFERENCE

The present invention claims priority to U.S. 62/684,710, filed on Jun. 13, 2018 and claims priority to TW 107146331, filed on Dec. 21, 2018.

BACKGROUND OF THE INVENTION

Field of Invention

The present invention relates to a power conversion system. In particular, the present invention relates to such power conversion system having multiple input sources. The present invention also relates to a power conversion apparatus and a control method of such power conversion system.

Description of Related Art

For relevant prior arts related to the present invention, one can refer to the followings: U.S. Patent Publication No. 20180069405 A1 and a literature entitled "An Effective Multi-Source Energy Harvester for Low Power Applications" published by IEEE in 2011.

Please refer to FIG. 1, which shows the prior art U.S. Patent Publication No. 20180069405 A1. The prior art U.S. Patent Publication No. 20180069405 A1 discloses a conventional power conversion system having multiple input sources (i.e., power conversion system 1). The power conversion system 1 includes plural DC/DC boost converters, respectively corresponding to different input powers generated from different energy harvesters (as shown by a solar panel energy harvester, a piezoelectric energy harvester, a wind turbine energy harvester, a magnetic induction energy harvester and a radio frequency energy harvester in FIG. 1), for converting a selected one of the input powers to an output power which is supplied to load (e.g., a battery cell group), through an input selection switch circuit.

The prior art shown in FIG. 1 has a drawback that: it requires a large number of DC/DC boost converters in correspondence to the energy harvesters. Consequently and undesirably, the circuit size of the power conversion system 1 is large and the manufacturing cost of the power conversion system 1 is high. Besides, this prior art cannot track the maximum power point, and therefore its power conversion efficiency is low.

Please refer to FIG. 2, which shows the prior art literature entitled "An Effective Multi-Source Energy Harvester for Low Power Applications" published by IEEE in 2011. The prior art shown in FIG. 2 discloses a conventional power conversion system having multiple input sources (i.e., power conversion system 2). In the power conversion system 2, plural maximum power point tracking (MPPT) circuits are provided in correspondence to plural energy harvesters, and a corresponding number of diodes are provided, so as to select the one having a highest voltage among different energy harvesters. The thus selected input power VSC is converted to an output power VOUT via a DC/DC converter.

The prior art shown in FIG. 2 has a drawback that: it requires a large number of MPPT circuits in correspondence to the energy harvesters. Consequently and undesirably, the circuit size of the power conversion system 2 is large and the manufacturing cost of the power conversion system 1 is high. Besides, by using the diodes, the power conversion system 2 can only select the one with the highest voltage among the energy harvesters, which is not flexible.

As compared to the prior arts shown in FIG. 1 and FIG. 2, the present invention has the merits that: first, different energy harvesters can share one MPPT circuit and one DC/DC converter, so that the circuit size and the manufacturing cost are reduced. Second, the present invention can elevate up the voltage of the input power by means of an impedance matching circuit capable of adjusting an impedance.

SUMMARY OF THE INVENTION

From one perspective, the present invention provides a power conversion apparatus for cooperating with a first energy harvester which harvests a first energy and provides a first input power, and cooperating with a second energy harvester which harvests a second energy and provides a second input power; the power conversion apparatus comprising: an adjustable impedance matching circuit, which is configured to operably generate an adjusted power at a first node according to the first input power; a first switch circuit coupled between the first node and a bus node; a second switch circuit coupled between the second input power and the bus node; a conversion control circuit, which is configured to operably control the first switch circuit and the second switch circuit according to a voltage of the adjusted power and/or a voltage of the second input power, to select and conduct one of the adjusted power or the second input power to generate the bus power at the bus node, wherein the conversion control circuit is configured to operably generate an impedance control signal for adjusting an impedance of the adjustable impedance matching circuit to maximize the voltage of the adjusted power; and a power conversion circuit, which is configured to operably convert the bus power to an output power.

In one embodiment, the conversion control circuit generates the bus power according to one of the following ways: (1) comparing the voltage of the adjusted power with the voltage of the second input power, to select one of the adjusted power and the second input power, which has a higher voltage than the other, as the bus power; or (2) comparing the voltage of the second input power with a first predetermined voltage, and when the voltage of the second input power is higher than the first predetermined voltage, selecting and conducting the second input power as the bus power.

In one embodiment, the conversion control circuit generates a conversion control signal according to a first sensing signal, to control the power conversion circuit, so that the first input power or the second input power is controlled to be substantially at its respective corresponding maximum power point; wherein the first sensing signal is related to at least one of the followings: (1) the voltage of the adjusted power; (2) the voltage of the second input power; or (3) a voltage of the bus power.

In one embodiment, the conversion control circuit controls a level of the output power generated from the power conversion circuit, so that the first sensing signal is not lower than a second predetermined voltage, wherein the second predetermined voltage is related to a maximum power point corresponding to the first input power or a maximum power point corresponding to the second input power.

In one embodiment, the conversion control circuit includes: a sample-and-hold circuit, which is configured to operably, under a situation where the adjusted power is selected as the bus power, sample and hold a divided voltage of an open circuit voltage of the adjusted power, as the second predetermined voltage; or, wherein the sample-and-hold circuit is configured to operably, under a situation where the second input power is selected as the bus power, sample and hold a divided voltage of an open circuit voltage of the second input power, as the second predetermined voltage.

In one embodiment, the first input power is in a form of AC power; wherein the power conversion apparatus further includes a rectifier circuit which includes at least one rectifying device, and wherein the rectifier circuit is arranged by one of the following ways: (1) the rectifying device is coupled between an output terminal of the adjustable impedance matching circuit and the first node, wherein the rectifying device is configured to operably rectify an output signal of the adjustable impedance matching circuit, to generate the adjusted power at the first node; or (2) the rectifying device is coupled between an output terminal of the adjustable impedance matching circuit and the bus node, wherein the rectifying device is configured to operably rectify the adjusted power, to generate the adjusted power at the bus node; wherein the first switch circuit includes the rectifying device, the rectifying device being configured to operably control whether to conduct the adjusted power as the bus power.

In one embodiment, the rectifying device is a rectifying diode.

In one embodiment, the adjustable impedance matching circuit includes a variable capacitor having a capacitance which is adjustable in an analog and continuous manner according to the impedance control signal, whereby the impedance of the adjustable impedance matching circuit is adjustable in an analog and continuous manner.

In one embodiment, the second switch circuit includes a path switch, which is configured to operably control a conduction path between the second input power and the bus power, and wherein the conversion control circuit includes a first comparison circuit, which is configured to operably compare the voltage of the second input power with the first predetermined voltage to generate a first comparison result, the conversion control circuit being configured to operably control whether the path switch conducts the second input power as the bus power according to the first comparison result.

In one embodiment, the conversion control circuit further determines whether to enable the impedance control signal according to the first comparison result, wherein when the voltage of the second input power is lower than the first predetermined voltage, the conversion control circuit enables the impedance control signal.

In one embodiment, the conversion control circuit includes: a bias sensing circuit coupled between the bus node and a sensing node, the bias sensing circuit being configured to operably generate a second sensing signal at the sensing node according to the voltage of the bus power; a clamper circuit coupled to the sensing node, the clamper circuit being configured to operably clamp the second sensing signal, so that the second sensing signal is not greater than a clamping voltage; and a second comparison circuit, which is configured to operably generate the conversion control signal according to a difference between the second sensing signal and a third predetermined voltage.

In one embodiment, the bias sensing circuit includes: a bias resistor, which is configured to operably provide a bias current; and a sensing capacitor, wherein the sensing capacitor and the bias resistor are coupled to each other in parallel between the bus power and the sensing node.

In one embodiment, the bias resistor is a parasitic resistor of the sensing capacitor.

In one embodiment, the clamper circuit includes a clamping diode, and the clamping voltage is related to a forward voltage of the clamping diode.

In one embodiment, the conversion control circuit further generates the impedance control signal according to the conversion control signal.

In one embodiment, the conversion control circuit periodically selects and conducts one of the adjusted power or the second input power as the bus power according to a comparison result between the voltage of the adjusted power and the voltage of the second input power or a comparison result between the voltage of the second input power and the first predetermined voltage.

In one embodiment, the power conversion circuit is selected from one of the followings: (1) a boost switching regulator; (2) a buck switching regulator; (3) a buck-boost switching regulator; (4) a low-dropout linear regulator (LDO); or (5) a charger circuit.

In one embodiment, the second input power is further coupled to the adjustable impedance matching circuit for controlling the impedance of the adjustable impedance matching circuit to raise the voltage of the adjusted power.

From another perspective, the present invention provides a multi-source energy harvester system, a first energy harvester configured to operably harvest a first energy and provide a first input power; a second energy harvester configured to operably harvest a second energy and provide a second input power; and a power conversion apparatus including: an adjustable impedance matching circuit, which is configured to operably generate an adjusted power at a first node according to the first input power; a first switch circuit coupled between the first node and a bus node; a second switch circuit coupled between the second input power and the bus node; a conversion control circuit, which is configured to operably control the first switch circuit and the second switch circuit according to a voltage of the adjusted power and/or a voltage of the second input power, to select and conduct one of the adjusted power or the second input power to generate the bus power at the bus node, wherein the conversion control circuit is configured to operably generate an impedance control signal for adjusting an impedance of the adjustable impedance matching circuit to maximize the voltage of the adjusted power; and a power conversion circuit, which is configured to operably convert the bus power to an output power.

From yet another perspective, the present invention provides a method for controlling a multi-source energy harvester system, wherein the multi-source energy harvester system comprises a power conversion apparatus, a first energy harvester and a second energy harvester, wherein the first energy harvester is configured to operably harvest a first energy and provide a first input power, and the second energy harvester is configured to operably harvest a second energy and provide a second input power; the power conversion apparatus including: an adjustable impedance matching circuit, which is configured to operably generate an adjusted power at a first node according to the first input power; a first switch circuit coupled between the first node and a bus node; a second switch circuit coupled between the second input power and the bus node; and a power conversion circuit, which is configured to operably convert a bus power to an output power; the method comprising: controlling the first switch circuit and the second switch circuit according to a voltage of the adjusted power and/or a voltage of the second input power, to select and conduct one of the adjusted power or the second input power as the bus power, thereby generating the bus power at the bus node; and adjusting an impedance of the adjustable impedance matching circuit, to maximize the voltage of the adjusted power.

In one embodiment, the step for generating the bus power includes one of the following ways: (1) comparing the voltage of the adjusted power with the voltage of the second input power, to select one of the adjusted power and the second input power, which has a higher voltage than the other, as the bus power; or (2) comparing the voltage of the second input power with a first predetermined voltage, and when the voltage of the second input power is higher than the first predetermined voltage, selecting and conducting the second input power as the bus power.

In one embodiment, the method further comprises: controlling the power conversion circuit according to a first sensing signal, so that the first input power or the second input power is controlled to be substantially at its respective corresponding maximum power point; wherein the first sensing signal is related to at least one of the followings: (1) the voltage of the adjusted power; (2) the voltage of the second input power; or (3) a voltage of the bus power.

In one embodiment, the step for controlling the power conversion circuit includes: controlling a level of the output power generated from the power conversion circuit, so that the first sensing signal is not lower than a second predetermined voltage, wherein the second predetermined voltage is related to a maximum power point corresponding to the first input power or a maximum power point corresponding to the second input power.

In one embodiment, the second input power is further configured to operably control the impedance of the adjustable impedance matching circuit, so as to raise the voltage of the adjusted power.

From still another perspective, the present invention provides a power conversion apparatus for cooperating with a first energy harvester which harvests a first energy and provides a first input power, and cooperating with a second energy harvester which harvests a second energy and provides a second input power; the power conversion apparatus comprising: an adjustable impedance matching circuit, which is configured to operably generate an adjusted power at a first node according to the first input power, wherein the second input power controls an impedance of the adjustable impedance matching circuit, to maximize the voltage of the adjusted power; a power conversion circuit, which is configured to operably generate an output power according to the adjusted power; and a conversion control circuit, which is configured to operably generate a conversion control signal for controlling the power conversion circuit, so that the adjusted power is controlled to be substantially at a corresponding maximum power point.

In one embodiment, the first energy harvester is a radio frequency antenna or an electromagnetic induction apparatus, the first energy being wireless radio frequency energy, the first input power being in a form of AC power, and the second energy harvester is a photovoltaic cell, which is configured to operably harvest photovoltaic energy.

In one embodiment, the power conversion apparatus further comprises: a first switch circuit coupled between the first node and a bus node; and a second switch circuit coupled between the second input power and the bus node; wherein the conversion control circuit is configured to operably control the first switch circuit and the second switch circuit according to a voltage of the adjusted power and/or a voltage of the second input power, to select and conduct one of the adjusted power or the second input power to generate the bus power at the bus node; wherein the power conversion circuit is configured to operably convert the bus power to the output power.

In one embodiment, the conversion control circuit further generates an impedance control signal for adjusting the impedance of the adjustable impedance matching circuit to maximize the voltage of the adjusted power.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
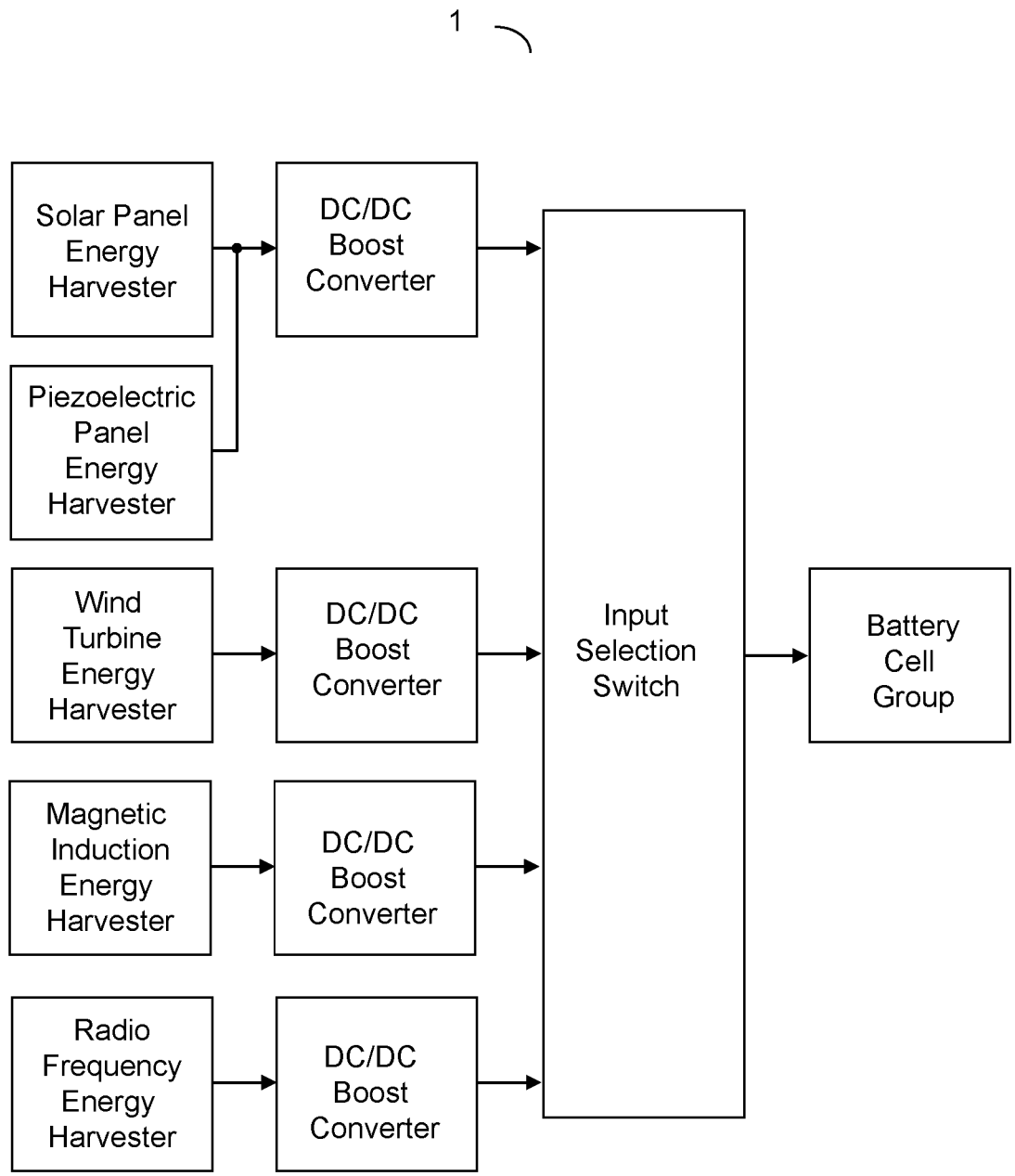
FIG. 1 shows a schematic block diagram of a conventional multi-source energy harvester system.
Figure 2:
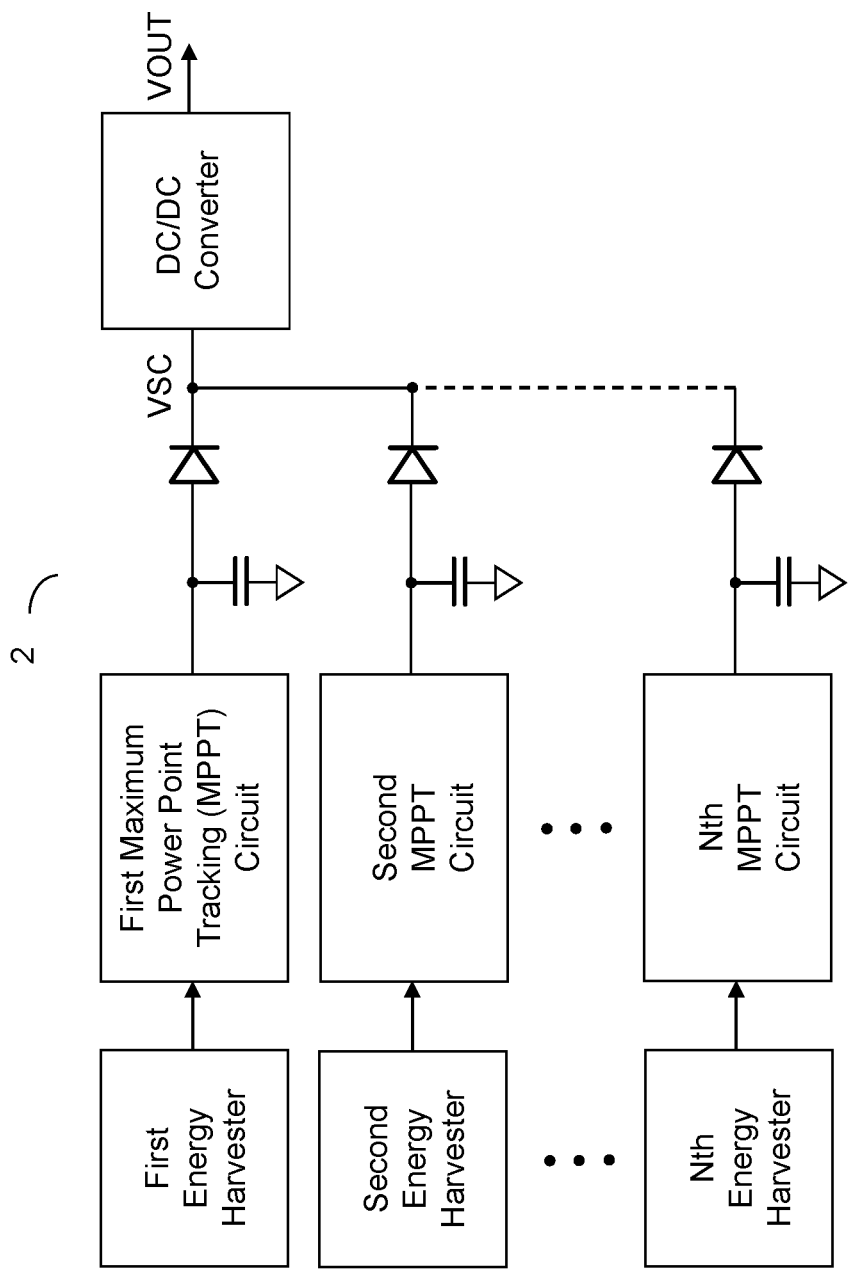
FIG. 2 shows a schematic block diagram of another conventional multi-source energy harvester system.
Figure 3A:
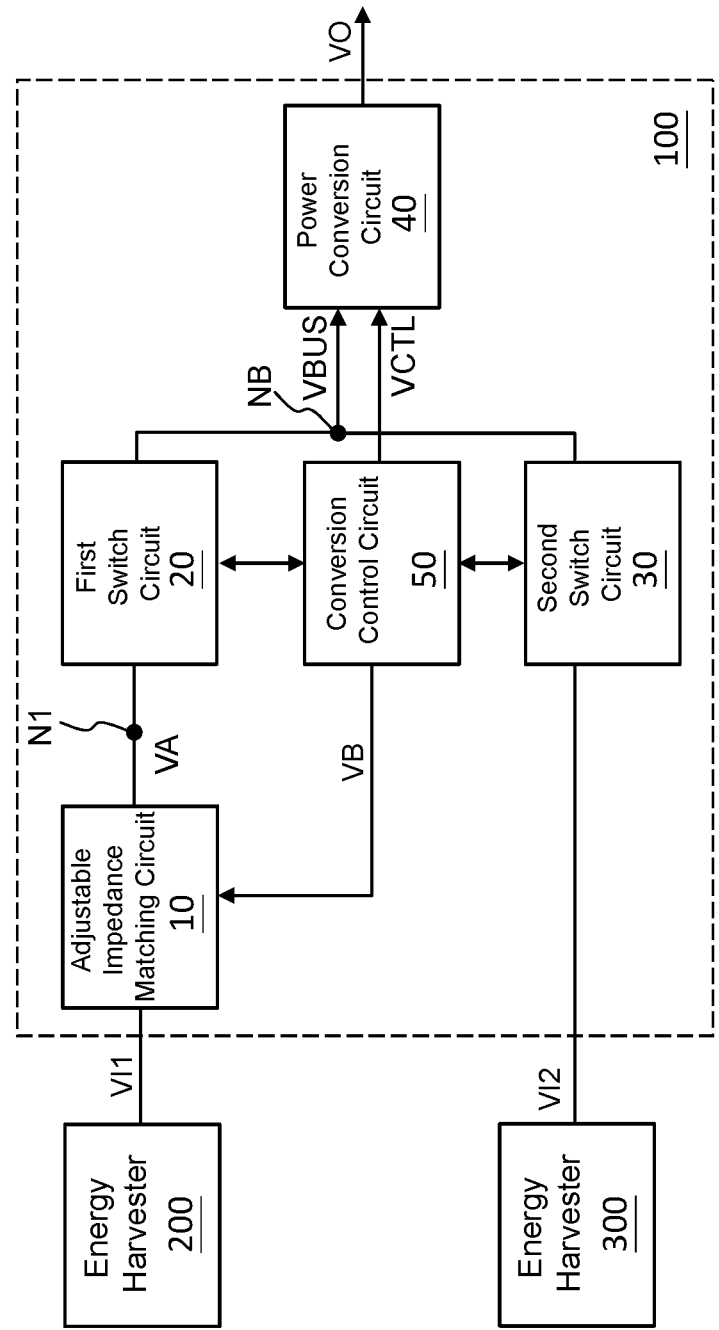
FIG. 3A shows a schematic block diagram of a multi-source energy harvester system and a power conversion apparatus according to an embodiment of the present invention.

Please refer to FIG. 3A, which shows a schematic block diagram of a multi-source energy harvester system (i.e., multi-source energy harvester system 3A) and a power conversion apparatus (i.e., power conversion apparatus 100) according to an embodiment of the present invention. The multi-source energy harvester system 3A includes plural energy harvesters 200 and 300 and a power conversion apparatus 100.

The energy harvester 200 and the energy harvester 300 can harvest a first energy having a corresponding form to the energy harvester 200 and a second energy having a corresponding form to the energy harvester 300, to provide a first input power VI1 and a second input power VI2, respectively. In one embodiment, the energy harvester 200 can harvest a power in AC form and convert such AC power to a first input power VI1 in AC form. For example, the energy harvester 200 can be a piezoelectric energy harvester, which is configured to operably harvest vibration voltage energy and convert such vibration voltage energy to the first input power VI1 in AC form. For another example, the energy harvester 200 can be a radio frequency antenna or an electromagnetic induction apparatus, which is configured to operably harvest radio frequency energy or electromagnetic energy and convert such radio frequency energy or electromagnetic energy to the first input power VI1 in AC form. In one embodiment, the energy harvester 300 can harvest a power in DC form and convert such DC power to a second input power VI2 in DC form. For example, the energy harvester 300 can be a photovoltaic cell or a thermoelectric device, which is configured to operably harvest photovoltaic energy or thermoelectric energy and convert such photovoltaic energy or thermoelectric energy to the second input power VI2 in DC form. Certainly, it is also practicable and within the scope of the present invention that the energy harvesters of the multi-source energy harvester system can be any combination of the above-mentioned different forms of energy harvesters.

Please still refer to FIG. 3A. The power conversion apparatus 100 comprises an adjustable impedance matching circuit 10, a first switch circuit 20, a second switch circuit 30, a conversion control circuit 50 and a power conversion circuit 40.

The adjustable impedance matching circuit 10 is configured to operably generate an adjusted power VA at a first node N1 according to the first input power VI1. The first switch circuit 20 is coupled between the first node N1 and a bus node NB. The first switch circuit 20 is configured to operably control a conduction path between the first node N1 and the bus node NB. The second switch circuit 30 is coupled between the second input power VI2 and the bus node NB. The second switch circuit 30 is configured to operably control a conduction path between the second input power VI2 and the bus node NB.

The conversion control circuit 50 is configured to operably control the first switch circuit 20 and the second switch circuit 30 according to a voltage of the adjusted power VA and/or a voltage of the second input power VI2, to select and conduct one of the adjusted power VA or the second input power VI2 as a bus power VBUS, thereby generating the bus power VBUS at the bus node NB. According to the present invention, the conversion control circuit 50 can select one of the adjusted power VA or the second input power VI2 as the bus power VBUS through various different ways. In one embodiment, the conversion control circuit 50 can compare the voltage of the adjusted power VA with the voltage of the second input power VI2, to select one having a higher voltage between the adjusted power VA and the second input power VI2 as the bus power VBUS. In another embodiment, the conversion control circuit 50 can compare the voltage of the second input power VI2 with a first predetermined voltage. When the voltage of the second input power VI2 is higher than the first predetermined voltage, the conversion control circuit 50 selects and conduct the second input power VI2 as the bus power VBUS.

Besides, according to another embodiment of the present invention, the conversion control circuit 50 can periodically compare the voltage of the adjusted power VA and the voltage of the second input power VI2 or periodically compare the voltage of the second input power VI2 and the first predetermined voltage VR1, and correspondingly selects and conducts one of the adjusted power VA or the second input power VI2 as the bus power VBUS according to a comparison result between the voltage of the adjusted power VA and the voltage of the second input power VI2 or according to a comparison result between the voltage of the second input power VI2 and the first predetermined voltage VR1.

The power conversion circuit 40 is configured to operably convert the bus power VBUS to an output power VO. The power conversion circuit 40 can be selected from one of the followings: (1) a boost switching regulator; (2) a buck switching regulator; (3) a buck-boost switching regulator; (4) a low-dropout linear regulator (LDO); or (5) a charger circuit. Note that, the term "charger circuit" refers to a power conversion circuit that can operate under a constant current power supply mode and under a constant voltage power supply mode, so that the charger circuit, while performing a charging operation to a rechargeable battery, can operate under desired power conversion modes during different charging phases. Power conversion circuits are well known to those skilled in the art and those skilled in this art can readily conceive variations and modifications within the spirit of the present invention, so the details thereof are not redundantly explained here.

Figure 3B:
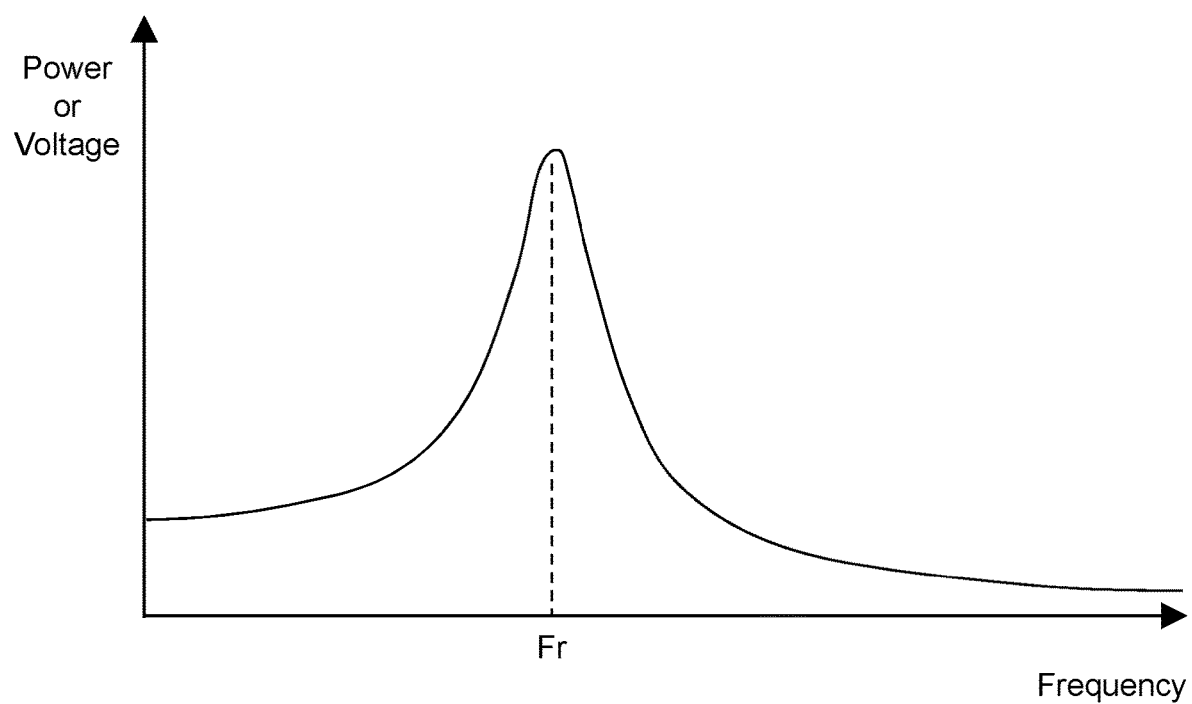
FIG. 3B shows a characteristic curve corresponding to FIG. 3A.

Besides, according to the present invention, in one embodiment, the conversion control circuit 50 is configured to operably generate an impedance control signal VB, to adjust an impedance of the adjustable impedance matching circuit 10, thereby controlling or adjusting characteristic parameters of the adjusted power VA. Please refer to FIG. 3A in conjugation with FIG. 3B. FIG. 3B shows a characteristic curve corresponding to FIG. 3A. As shown in FIG. 3B, in the embodiment wherein the first energy is for example radio frequency energy and the energy harvester 200 is a radio frequency antenna, the resonant frequency of the energy harvester 200 can be adjusted by adjusting an impedance of the adjustable impedance matching circuit 10. For example, the impedance of the adjustable impedance matching circuit 10 can be adjusted so that the resonant frequency of the energy harvester 200 corresponds to the resonant frequency Fr shown in FIG. 3B, whereby the energy harvester 200 is optimized to harvest a maximum energy. In another embodiment, the voltage of the adjusted power VA can be adjusted by adjusting an impedance of the adjustable impedance matching circuit 10. In one embodiment, the conversion control circuit 50 can adjust the impedance of the adjustable impedance matching circuit 10 by an impedance control signal VB, to maximize the voltage of the adjusted power VA.

Figure 3C:
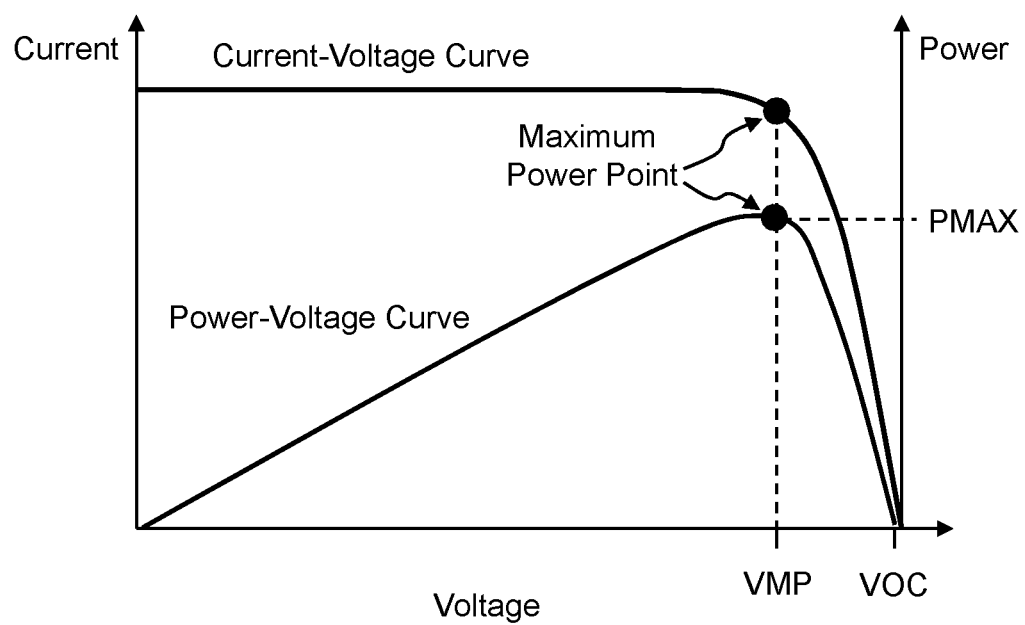
FIG. 3C shows characteristic curves of an energy harvester.
Figure 3D:
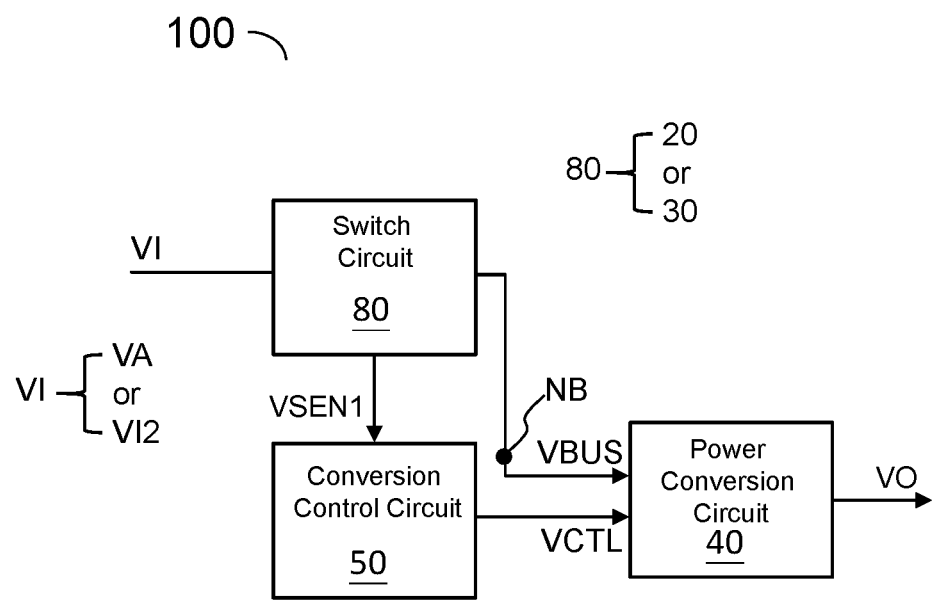
FIG. 3D shows an embodiment of a power conversion apparatus of the present invention.

Please refer to FIG. 3A, FIG. 3C and FIG. 3D. FIG. 3C shows a characteristic curve of a typical energy harvester (e.g., a photovoltaic energy harvester). FIG. 3D shows an embodiment of a power conversion apparatus of the present invention. As shown in FIG. 3C, the energy harvester has a maximum power point PMAX, which corresponds to a voltage having a level lower than an open circuit voltage VOC (i.e., maximum power point voltage VMP). In one embodiment, as shown in FIG. 3D, the conversion control circuit 50 generates a conversion control signal VCTL according to a first sensing signal VSEN1, to control the power conversion circuit 40, so that the first input power VI1 or the second input power VI2 is controlled to be substantially at its respective corresponding maximum power point. In one embodiment, the conversion control signal VCTL can control a level of the output power generated from the power conversion circuit 40, so that the first input power VI1 or the second input power VI2 is controlled to be substantially at its respective corresponding maximum power point. It should be noted that, in one embodiment, the input power VI corresponds to the adjusted power VA or the second input power VI2 described in the above-mentioned embodiment, while, the switch circuit 80 corresponds to the first switch circuit 20 or the second switch circuit 30 described in the above-mentioned embodiment.

The above-mentioned first sensing signal VSEN1 can be implemented by various ways. More specifically, according to the present invention, the first sensing signal VSEN1 is related to at least one of the followings: (1) the voltage of the adjusted power VA; (2) the voltage of the second input power VI2; or (3) the voltage of the bus power VBUS. To be much more specific, under a situation where the conversion control circuit 50 selects and conducts the adjusted power VA to generate the bus power VBUS at the bus node NB, the conversion control circuit 50 can generate a conversion control signal VCTL according to the voltage of the adjusted power VA or the voltage of the bus power VBUS, and control the power conversion circuit 40 according to the conversion control signal VCTL, so that the first input power VI1 is controlled to be substantially at its corresponding maximum power point. On the other hand, under a situation where the conversion control circuit 50 selects and conducts the second input power VI2 to generate the bus power VBUS at the bus node NB, the conversion control circuit 50 can generates conversion control signal VCTL according to the voltage of the second input power VI2 or the voltage of the bus power VBUS, and control the power conversion circuit 40 according to the conversion control signal VCTL, so that the second input power VI2 is controlled to be substantially at its corresponding maximum power point.

Note that, because the circuit devices may have inherent parasitic effects or inherent mismatches, although it is desired to control the first input power VI1 or the second input power VI2 controlled to be exactly at its corresponding maximum power point (MPP), in practical implementation, the first input power VI1 or the second input power VI2 may not be controlled to be exactly at its corresponding maximum power point (MPP); instead, the first input power VI1 or the second input power VI2 may be close to but not exactly at its corresponding maximum power point (MPP). In other words, according to the present invention, the term "substantially at" does require the first input power VI1 or the second input power VI2 to be precisely at the maximum power point (MPP); instead, a tolerable error is acceptable. That "a tolerable error is acceptable" applies to all the context of the present invention.

Figure 4:
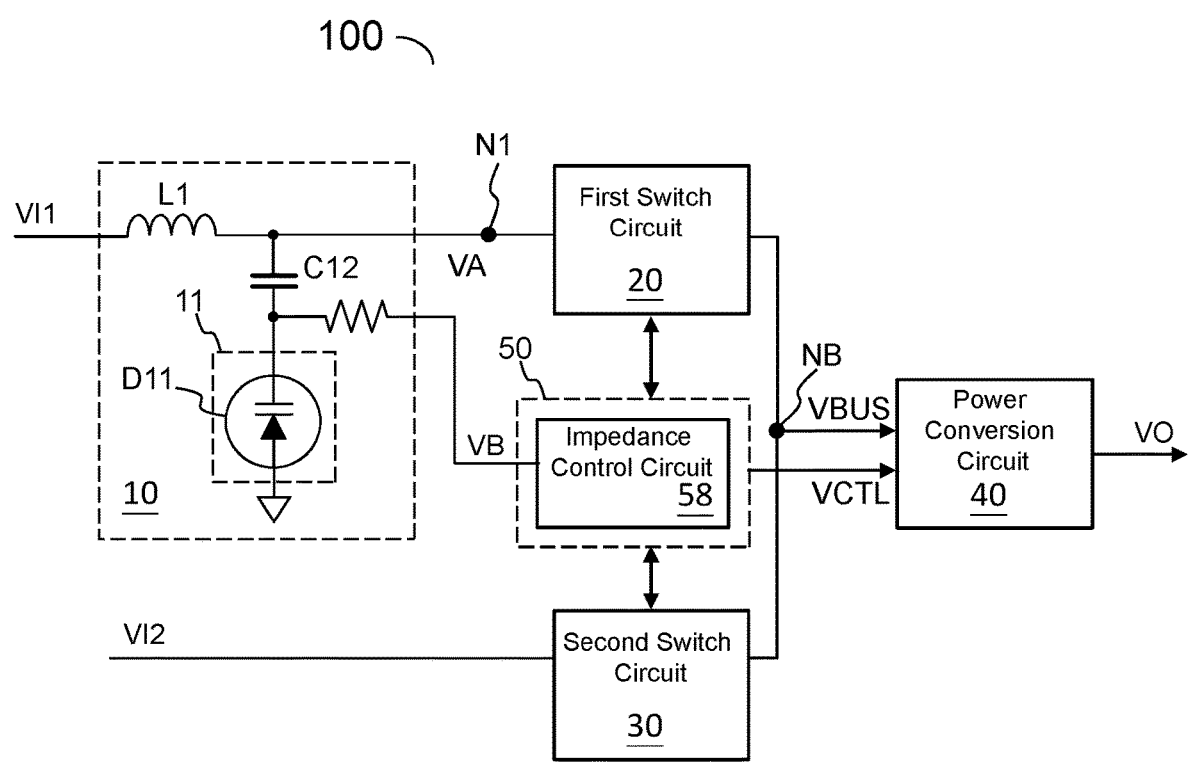
FIG. 4 shows an embodiment of an adjustable impedance matching circuit of a power conversion apparatus of the present invention.

The adjustable impedance matching circuit 10 can include typical impedance matching devices such as an inductor and one or more capacitors; these impedance matching devices can be designed to have adjustable parameters, so that the impedance of the adjustable impedance matching circuit 10 is adjustable, and the impedance (e.g., input impedance or output impedance) of the multi-source energy harvester system or the power conversion apparatus thereof is accordingly adjustable. Please refer to FIG. 4, which shows an embodiment of an adjustable impedance matching circuit of a power conversion apparatus of the present invention. As shown in FIG. 4, in this embodiment, the adjustable impedance matching circuit 10 includes a variable capacitor 11, which has a variable capacitance that is adjustable in an analog and continuous manner according to the impedance control signal VB, whereby the impedance of the adjustable impedance matching circuit 10 can be adjusted in an analog and continuous manner. In this specific embodiment, the adjustable impedance matching circuit 10 further includes an inductor L1 and a capacitor C12. In one embodiment, the variable capacitor 11 can be, for example but not limited to, a voltage-controlled variable capacitor or a voltage-controlled variable capacitance diode D11. Under such circumstance, correspondingly, the conversion control circuit 50 can include a corresponding impedance control circuit 58, which is configured to operably generate the impedance control signal VB.

Note that, in another embodiment, the variable capacitor 11 can be a combination of one or more capacitors and one or more switches. Under such situation, the impedance control signal VB can be configured to operably control the switch(es) of the variable capacitor 11, so as to adjust a capacitance of the variable capacitor 11.

Figure 5A:
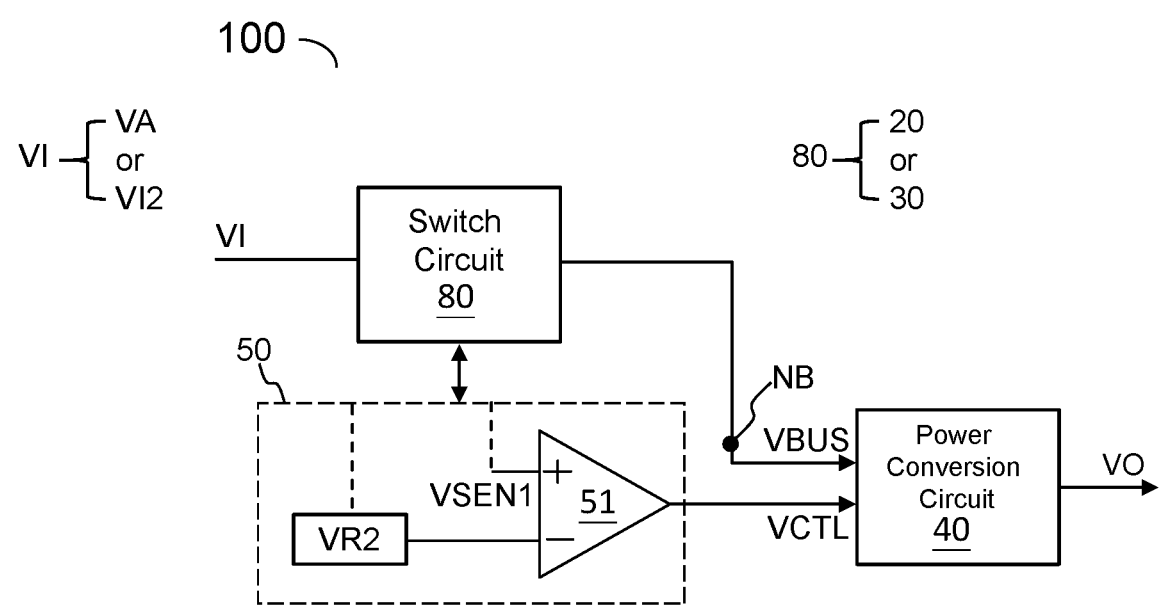
FIG. 5A shows another embodiment of a power conversion apparatus of the present invention.

In one embodiment, the conversion control signal VCTL can control a level of the output power generated from the power conversion circuit 40, so that the first sensing signal VSEN1 is not lower than a second predetermined voltage, wherein the second predetermined voltage is related to a maximum power point corresponding to the first input power VI1 or a maximum power point corresponding to the second input power VI2. Please refer to FIG. 5A, which shows another embodiment of a power conversion apparatus of the present invention. As shown in FIG. 5A, in this specific embodiment, the conversion control circuit 50 can include a comparison circuit 51, which is configured to operably compare the first sensing signal VSEN1 with the second predetermined voltage VR2, and generate the conversion control signal VCTL accordingly, to control the power conversion circuit 40 so that the first sensing signal VSEN1 is not lower than a second predetermined voltage VR2. Note that the signs of the positive and negative input terminals of the comparison circuit 51 (and other comparison circuits in the present invention as well) are shown as an illustrative example, but not for limiting the scope of the present invention, and the positive and negative input terminals can be arranged in an opposite way with corresponding amendments of the definitions of the signal levels and/or circuits processing these signals.

In one preferred embodiment, under a situation where the conversion control circuit 50 selects and conducts the adjusted power VA to generate the bus power VBUS at the bus node NB, the second predetermined voltage VR2 is related to a maximum power point of the first input power VI1 (or corresponds to the adjusted power VA); on the other hand, under a situation where the conversion control circuit 50 selects and conducts the second input power VI2 to generate the bus power VBUS at the bus node NB, the second predetermined voltage VR2 is related to a maximum power point of the second input power VI2. Referring to FIG. 3C, the second predetermined voltage VR2 can be, for example but not limited to, the maximum power point voltage VMP or a voltage which is close to the maximum power point voltage VMP.

Figure 5B:
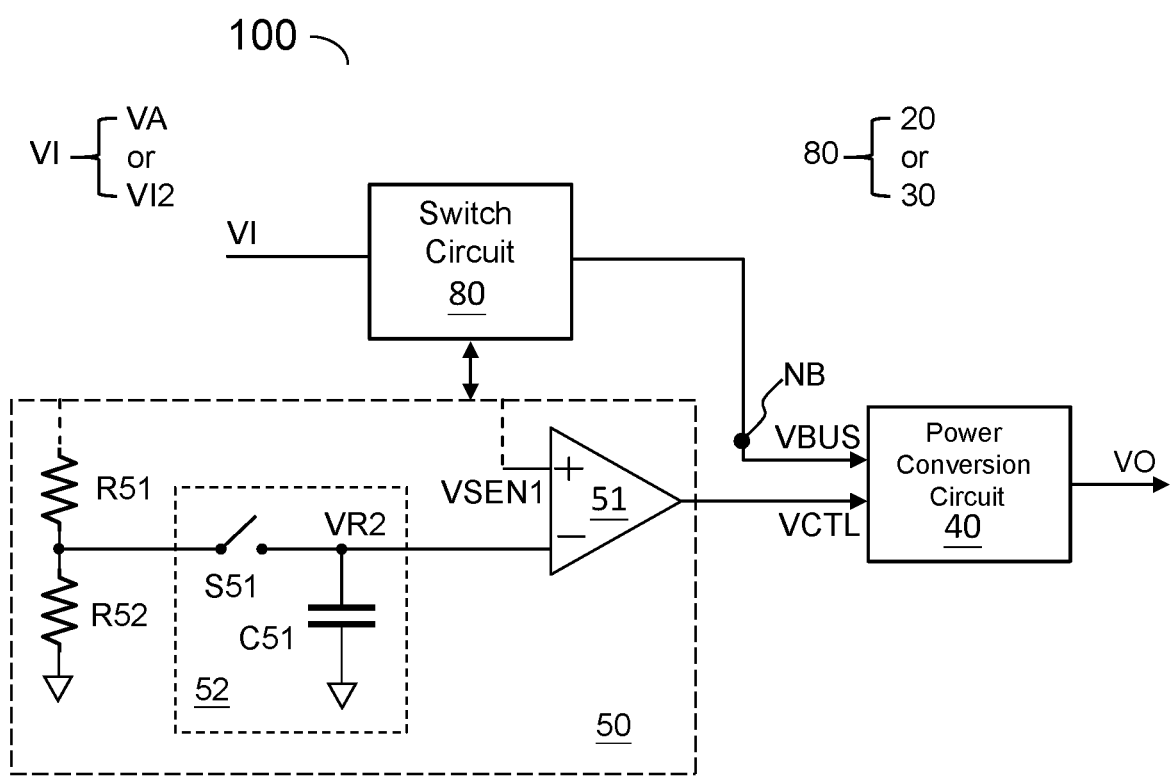
FIGS. 5B-5C show specific embodiments of a conversion control circuit of a power conversion apparatus of the present invention.
Figure 5C:
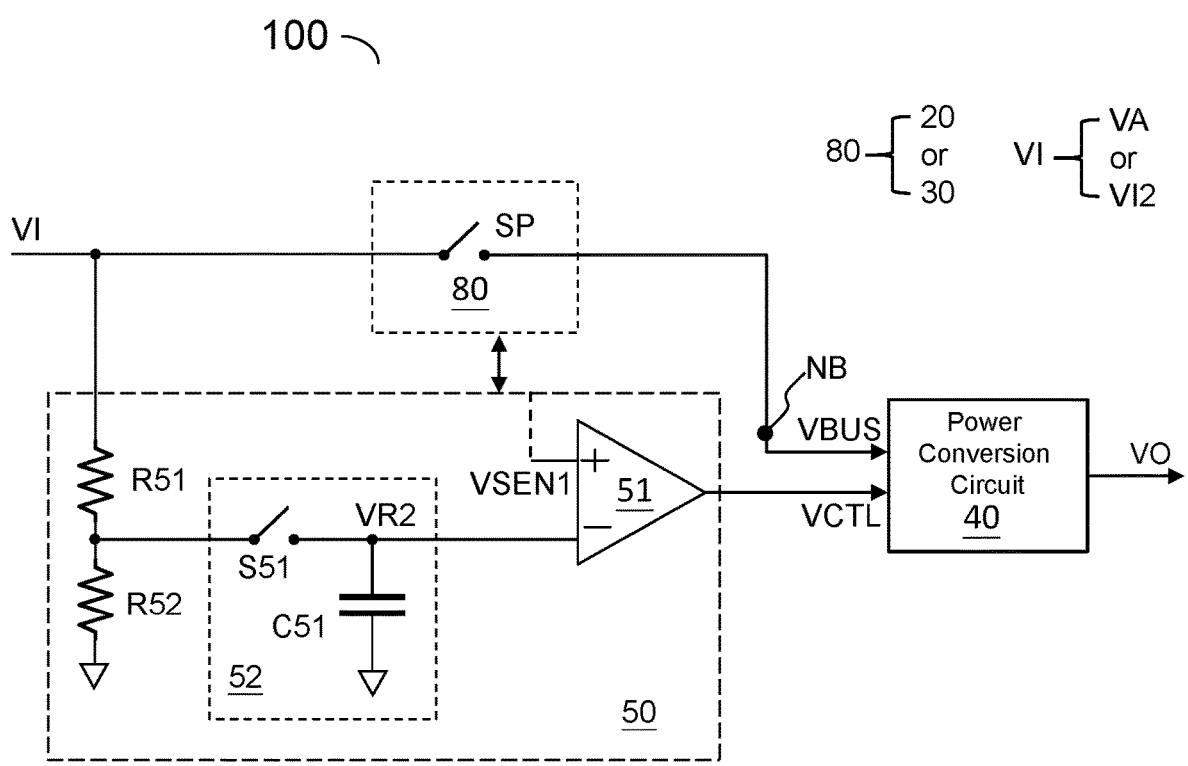

Please refer to FIGS. 5B-5C. FIGS. 5B-5C show specific embodiments of a conversion control circuit of a power conversion apparatus of the present invention. As shown in FIG. 5B, in one embodiment, the conversion control circuit includes a sample-and-hold circuit 52, which is configured to operably, under a situation where the adjusted power VA is selected as the bus power VBUS, sample and hold a divided voltage of an open circuit voltage of the adjusted power VA, as the second predetermined voltage VR2. Or, the sample-and-hold circuit 52 is configured to operably, under a situation where the second input power VI2 is selected as the bus power VBUS, sample and hold a divided voltage of an open circuit voltage of the second input power VI2, as the second predetermined voltage VR2. The above-mentioned open circuit voltage for example corresponds to the VOC shown in FIG. 3C. The so-called open circuit voltage, as described herein, refers to a voltage corresponding to a situation where a current of the adjusted power VA, the first input power VI1 or the second input power VI2 is equal to zero. In one embodiment, for example, a divided voltage of the above-mentioned open circuit voltage can be obtained by a resistor R51 and a resistor R52. In one embodiment, the sample-and-hold circuit 52 includes a switch S51 and a capacitor C51. Referring to FIG. 5C, in one embodiment, the second switch circuit 30 (or the first switch circuit 20) can include a path switch SP, which is configured to operably control the above-mentioned conduction path. In one embodiment, the sample-and-hold operation by the sample-and-hold circuit 52 is executed at a time point where the corresponding first switch circuit 20 or second switch circuit 30 is OFF; for example, in the embodiment of FIG. 5C, the time point is when the path switch SP is OFF. Under such circumstance, the conversion control circuit 50 can sample and hold a divided voltage of the above-mentioned open circuit voltage by the switch S51 and the capacitor C51, to generate the second predetermined voltage VR2.

Figure 6A:
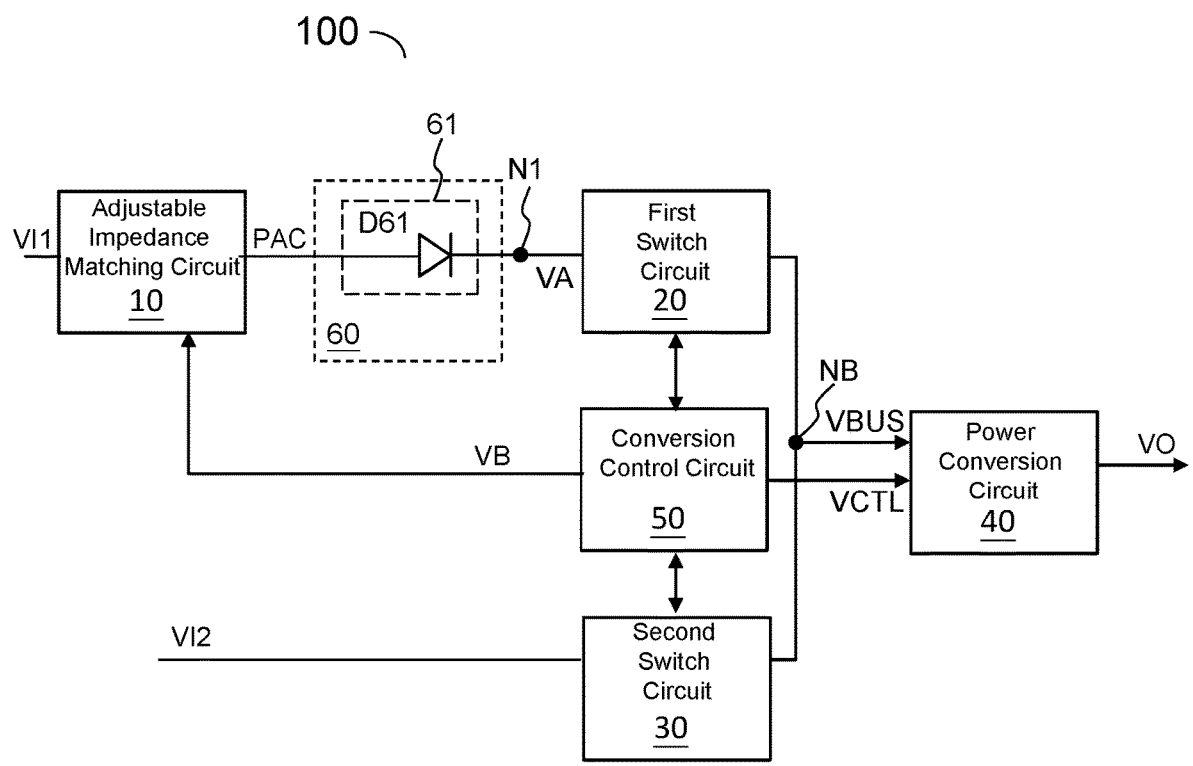
FIG. 6A shows an embodiment of a rectifying circuit of a power conversion apparatus of the present invention.

Please refer to FIG. 6A, which shows an embodiment of a rectifying circuit of a power conversion apparatus of the present invention. As described above, in one embodiment, the first input power VI1 can be in a form of AC power. Under such circumstance, the power conversion apparatus 100 can further include a rectifier circuit 60. The rectifier circuit 60 includes at least one rectifying device 61. As shown in FIG. 6A, in this embodiment, the rectifying device 61 is coupled between an output terminal of the adjustable impedance matching circuit 10 and the first node N1. The rectifying device 61 is configured to operably rectify an output signal PAC of the adjustable impedance matching circuit 10, to generate the adjusted power VA at the first node N1.

Figure 6B:
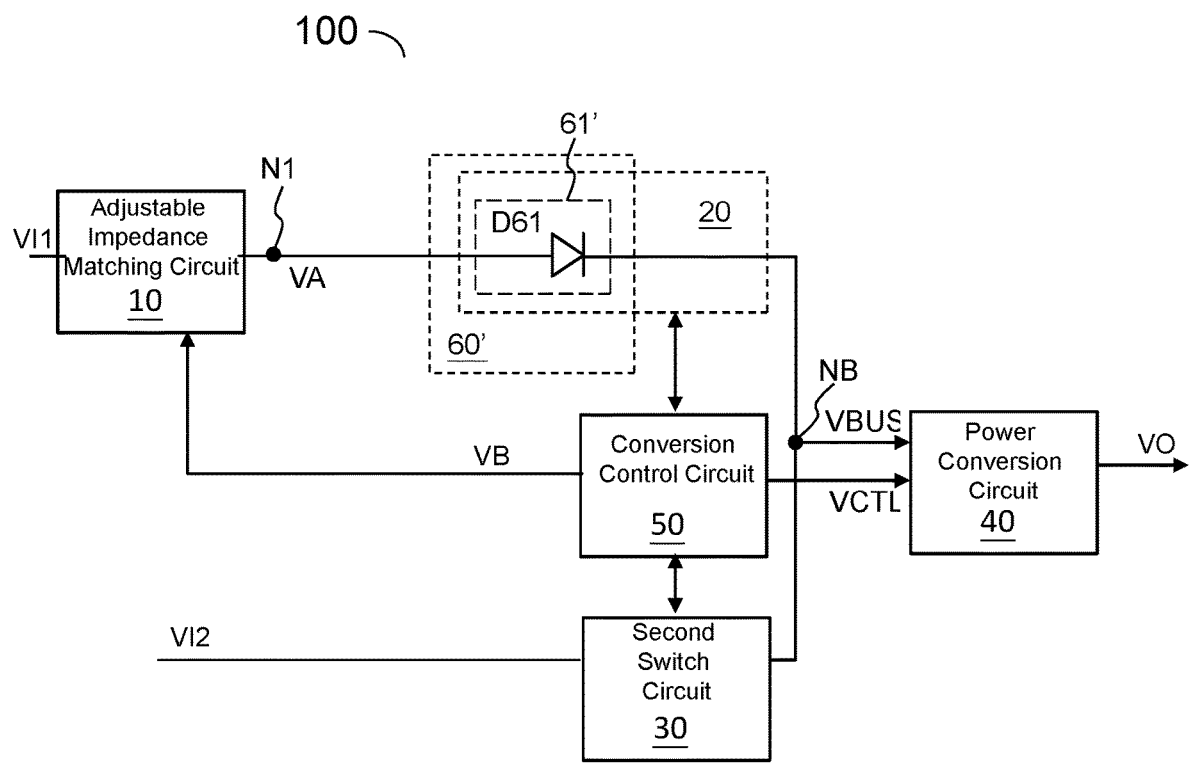
FIG. 6B shows an embodiment of a rectifying circuit and a switch circuit of a power conversion apparatus of the present invention.

Please refer to FIG. 6B, which shows an embodiment of a rectifying circuit and a switch circuit of a power conversion apparatus of the present invention. In one embodiment, the rectifier circuit can share a part of or all of the devices in the switch circuit. For example, as shown in FIG. 6B, the rectifier circuit 60' is coupled between the first node N1 and the bus node NB; in one embodiment, the rectifier circuit 60' includes a rectifying device 61' which is coupled between the first node N1 and the bus node NB, and the rectifying device 61' is configured to operably rectify the adjusted power VA to generate the bus power VBUS at the bus node NB. In this embodiment, the first switch circuit 20 also includes the rectifying device 61', and the rectifying device 61' is further configured to operably control whether to conduct the adjusted power VA as the bus power VBUS. In other words, the rectifying device 61' also corresponds to the above-mentioned path switch. As shown in FIGS. 6A-6B, in one embodiment, the rectifying device 61 (or 61') can be a rectifying diode D61. In other embodiments, the rectifying device can be a rectifying switch, performing synchronous rectification.

Figure 7:
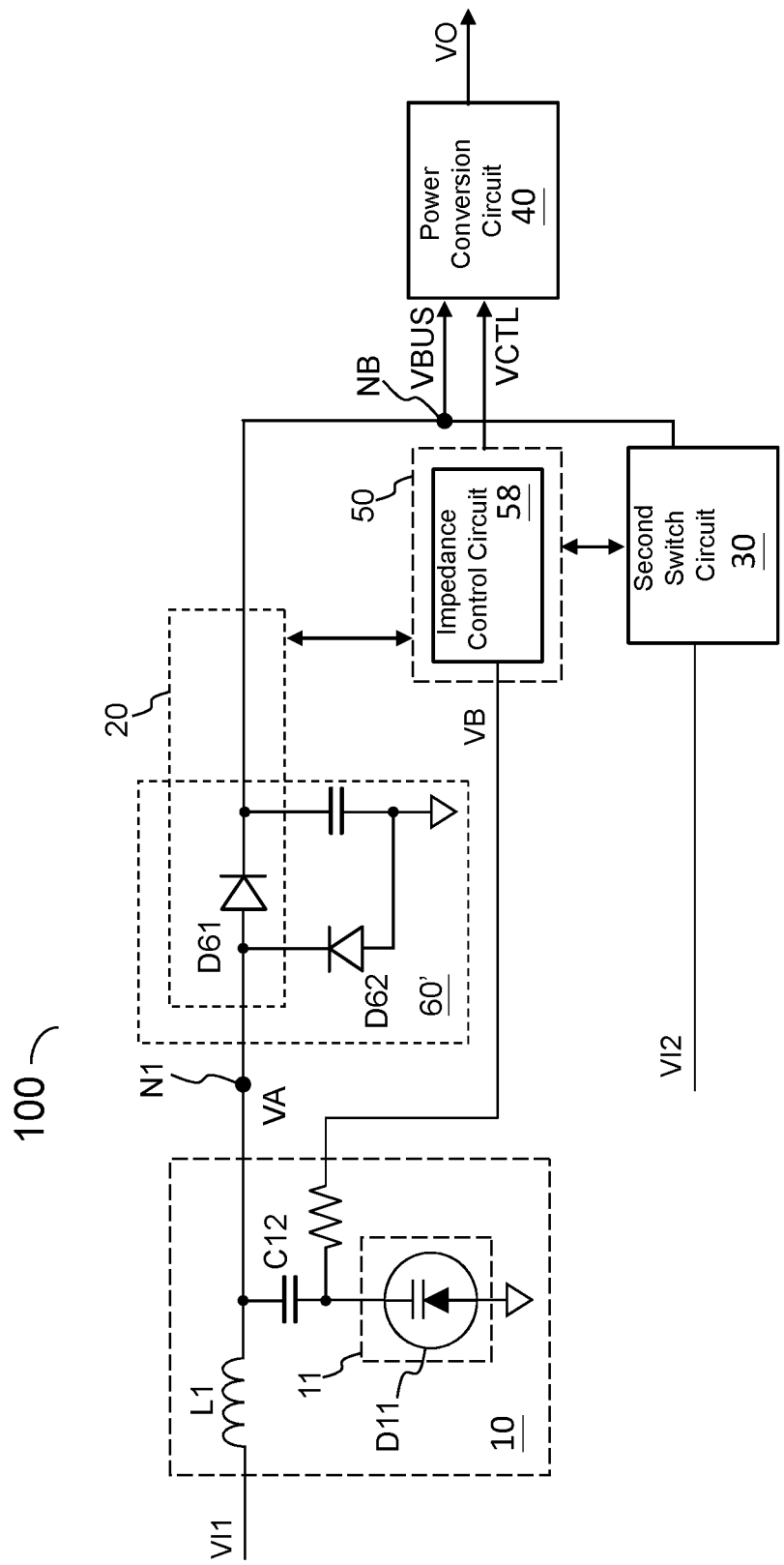
FIG. 7 shows a specific embodiment of a rectifying circuit and a switch circuit of a power conversion apparatus of the present invention.

Please refer to FIG. 7, which shows a specific embodiment of a rectifying circuit and a switch circuit of a power conversion apparatus of the present invention. In this embodiment, the rectifier circuit 60' includes a rectifying diode D61 and a rectifying diode D62, which are configured to operably rectify the adjusted power VA, to generate the bus power VBUS at the bus node NB. Besides, the first switch circuit 20 also includes the rectifying diode D61. In this embodiment, the rectifying diode D61 corresponds to the above-mentioned rectifying device and also corresponds to the above-mentioned path switch. To be more specific, when the voltage of the adjusted power VA is higher than the voltage of the bus power VBUS, the rectifying diode D61 is conductive, whereby the first input power VI1 is conducted to become the bus power VBUS. On the other hand, when the voltage of the adjusted power VA is lower than the voltage of the bus power VBUS, the rectifying diode D61 is OFF, and the conduction path between the first input power VI1 and the bus power VBUS is OFF.

Figure 8:
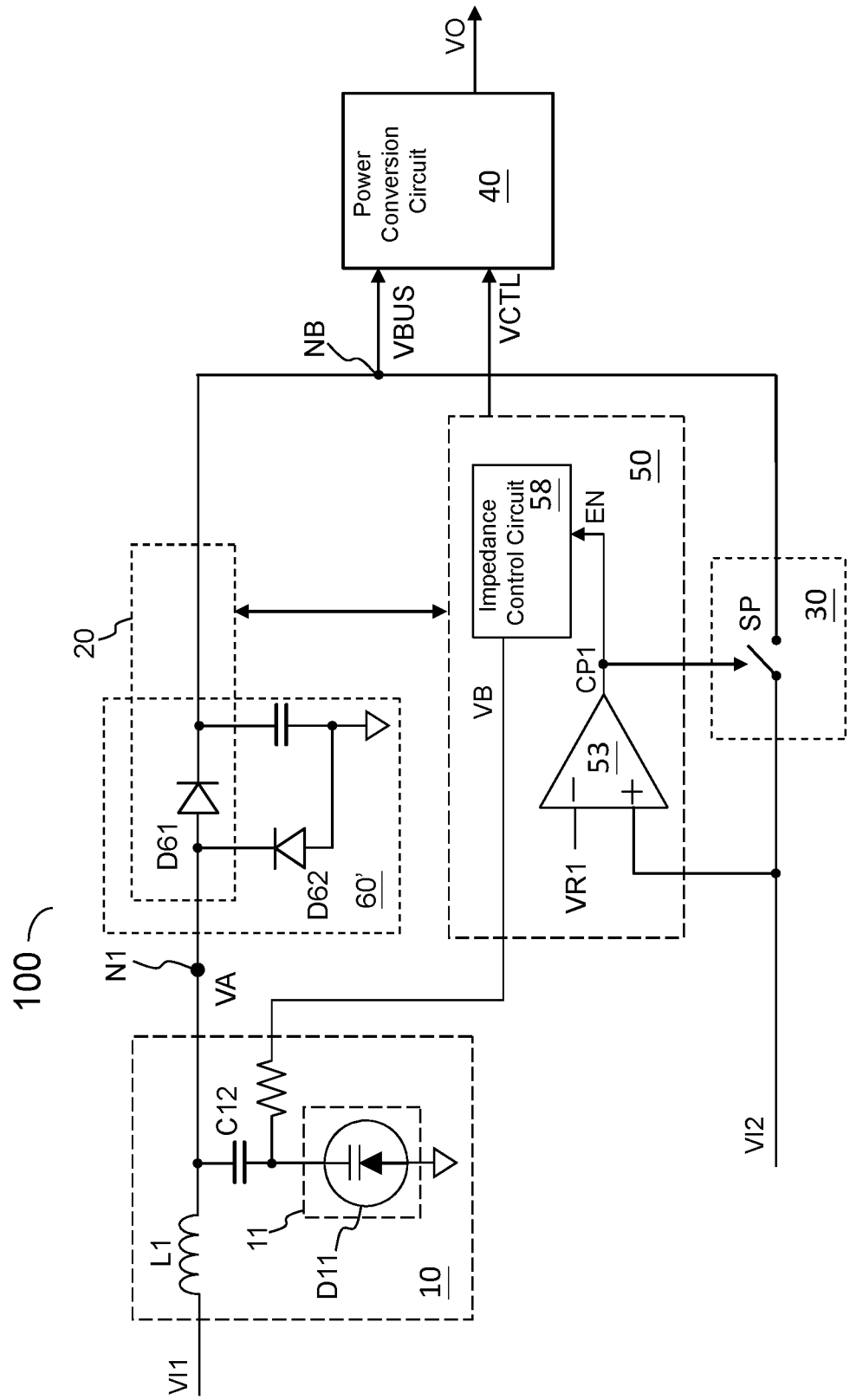
FIG. 8 shows another specific embodiment of a rectifying circuit and a switch circuit of a power conversion apparatus of the present invention.

Please refer to FIG. 8, which shows another specific embodiment of a rectifying circuit and a switch circuit of a power conversion apparatus of the present invention. As shown in FIG. 8, in one embodiment, the second switch circuit 30 includes a path switch SP, which is configured to operably control a conduction path between the second input power VI2 and the bus power VBUS. In this embodiment, the conversion control circuit 50 includes a comparison circuit 53, which is configured to operably compare the voltage of the second input power VI2 with the predetermined voltage VR1 (e.g., corresponding to the above-mentioned first predetermined voltage), to generate a comparison result CP1. The conversion control circuit 50 determines whether the path switch SP will conduct the second input power VI2 as the bus power VBUS according to the comparison result CP1. In one embodiment, when the voltage of the second input power VI2 is higher than the predetermined voltage VR1, the path switch SP is controlled to be conductive, so that the conversion control circuit 50 will select and conduct the second input power VI2 as the bus power VBUS. On the other hand, when the voltage of the second input power VI2 is lower than the predetermined voltage VR1, the path switch SP is controlled to be OFF (i.e., a conduction path between the second input power VI2 and the bus power VBUS is OFF). Under such circumstance, the rectifying diode D61 of this embodiment will be conductive when the voltage of the bus power VBUS is lower than the voltage of the adjusted power VA. That is, under such situation, the first input power VI1 is conducted to become the bus power VBUS.

Please still refer to FIG. 8. In one embodiment, the conversion control circuit 50 further determines whether to enable the impedance control signal VB according to the first comparison result CP1. To be more specific, the first comparison result CP1 can be used to determine whether the impedance control circuit 58 enables the impedance control signal VB (e.g., by an enable signal EN which is related to the first comparison result CP1) to control the impedance of the adjustable impedance matching circuit 10. More specifically, in one embodiment, when the voltage of the second input power VI2 is lower than the predetermined voltage VR1, the second switch circuit 30 is OFF. Under such situation, the conversion control circuit 50 can enable the impedance control signal VB to control the impedance of the adjustable impedance matching circuit 10, thereby maximizing the voltage or power of the first input power VI1. On the other hand, in one embodiment, when the voltage of the second input power VI2 is higher than the predetermined voltage VR1, the conversion control circuit 50 will disable the impedance control signal VB.

Figure 9:
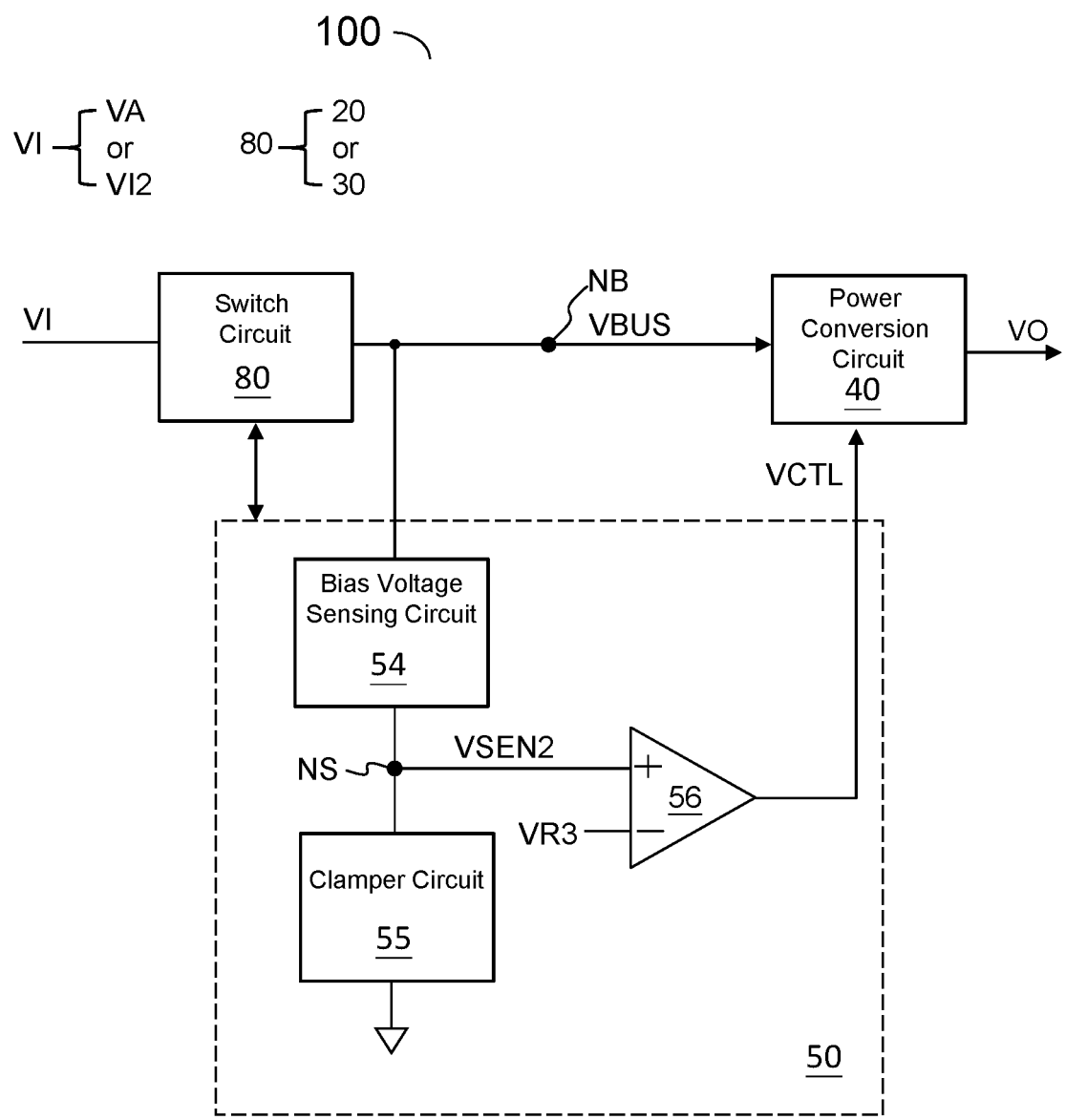
FIG. 9 shows another specific embodiment of a conversion control circuit of a power conversion apparatus of the present invention.

Please refer to FIG. 9, which shows another specific embodiment of a conversion control circuit of a power conversion apparatus of the present invention. In this embodiment, the conversion control circuit 50 includes: a bias sensing circuit 54, a clamper circuit 55 and a second comparison circuit 56.

The bias sensing circuit 54 is coupled between the bus node NB and a sensing node NS. The bias sensing circuit 54 is configured to operably generate a second sensing signal VSEN2 at the sensing node NS according to the voltage of the bus power VBUS. The clamper circuit 55 is coupled to the sensing node NS. The clamper circuit 55 is configured to operably clamp the second sensing signal VSEN2, so that the second sensing signal VSEN2 is not greater than a clamping voltage. The second comparison circuit 56 is configured to operably generate the conversion control signal VCTL according to a difference between the second sensing signal VSEN2 and a third predetermined voltage VR3, so as to control the first input power or the second input power to be substantially at its respective corresponding maximum power point.

Figure 10:
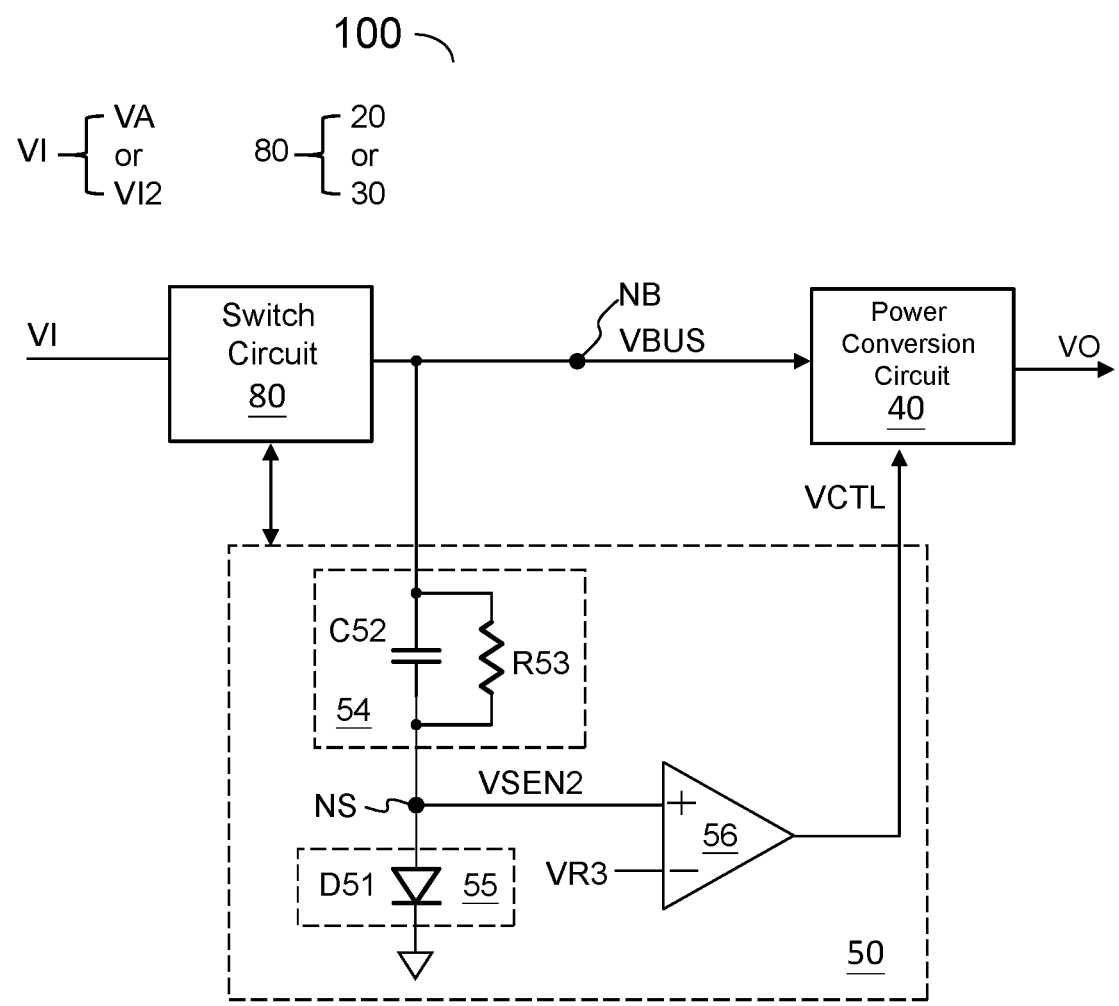
FIG. 10 shows a specific embodiment of a bias sensing circuit of a power conversion apparatus of the present invention.

Please refer to FIG. 10, which shows a specific embodiment of a bias sensing circuit of a power conversion apparatus of the present invention. In one embodiment, the bias sensing circuit 54 includes a bias resistor R53 and a sensing capacitor C52. The bias resistor is configured to operably supply a bias current. The sensing capacitor C52 and the bias resistor R53 are coupled in parallel to each other between the bus power VBUS and the sensing node NS. In one embodiment, the bias resistor R53 is a parasitic resistor of the sensing capacitor C52. That is, in one embodiment of circuit implementation, the bias sensing circuit 54 can simply be implemented by the sensing capacitor C52.

Please still refer to FIG. 10. In one embodiment, the clamper circuit 55 includes a clamping diode D51. The clamping voltage is related to a forward voltage of the clamping diode D51.

Figure 11:
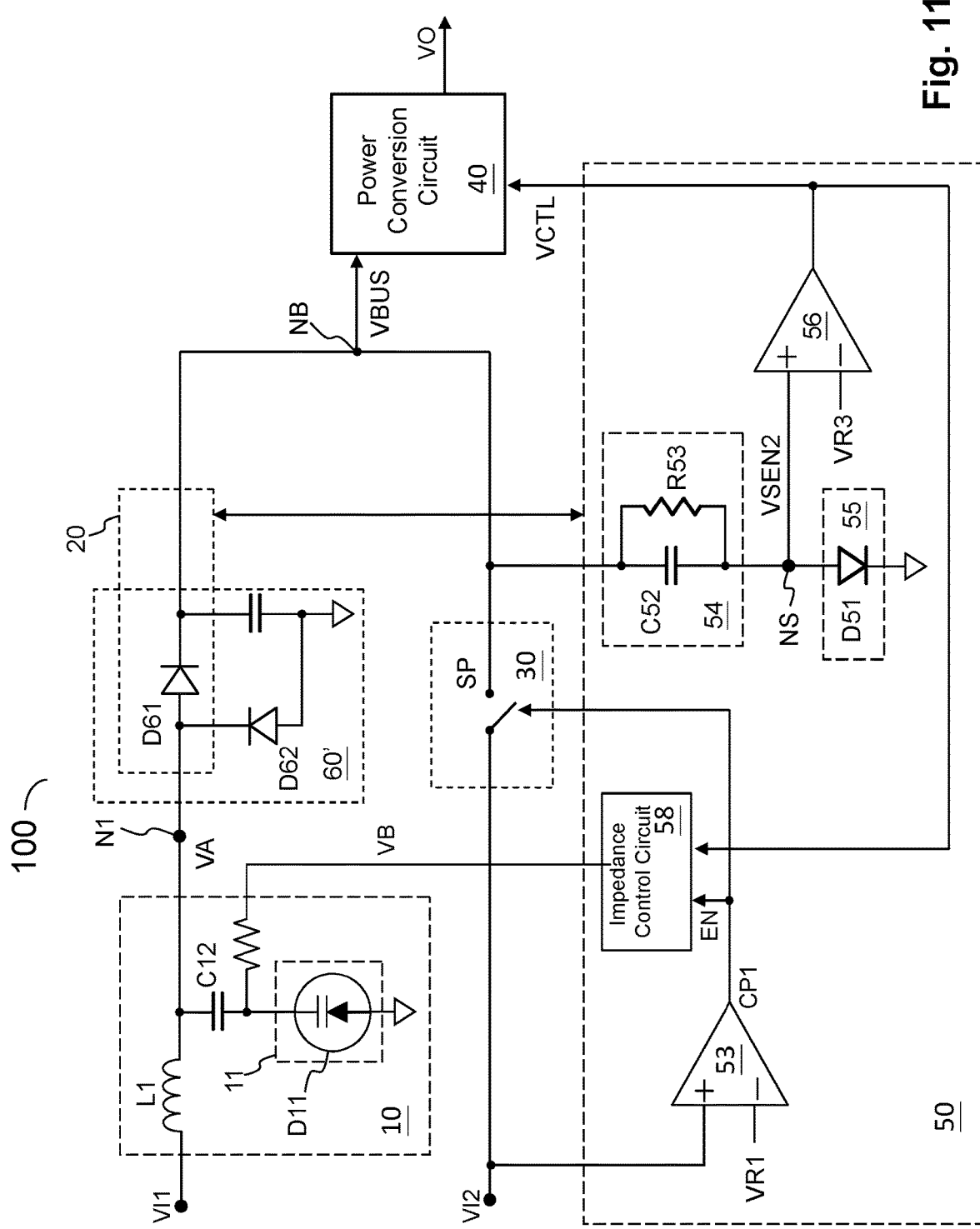
FIG. 11 shows still another specific embodiment of a conversion control circuit of a power conversion apparatus of the present invention.

Please refer to FIG. 11, which shows still another specific embodiment of a conversion control circuit of a power conversion apparatus of the present invention. In this embodiment, the MPPT circuit of the conversion control circuit 50 in FIG. 11 is implemented by a circuit structure similar to the MPPT circuit of the conversion control circuit 50 shown in FIG. 9 and FIG. 10, and in the embodiment of FIG. 11, the conversion control circuit 50 generates an impedance control signal VB according to a conversion control signal VCTL. To be more specific, the impedance control circuit 58 generates the impedance control signal VB according to the conversion control signal VCTL (which is different from the embodiment of FIG. 4).

Figure 12:
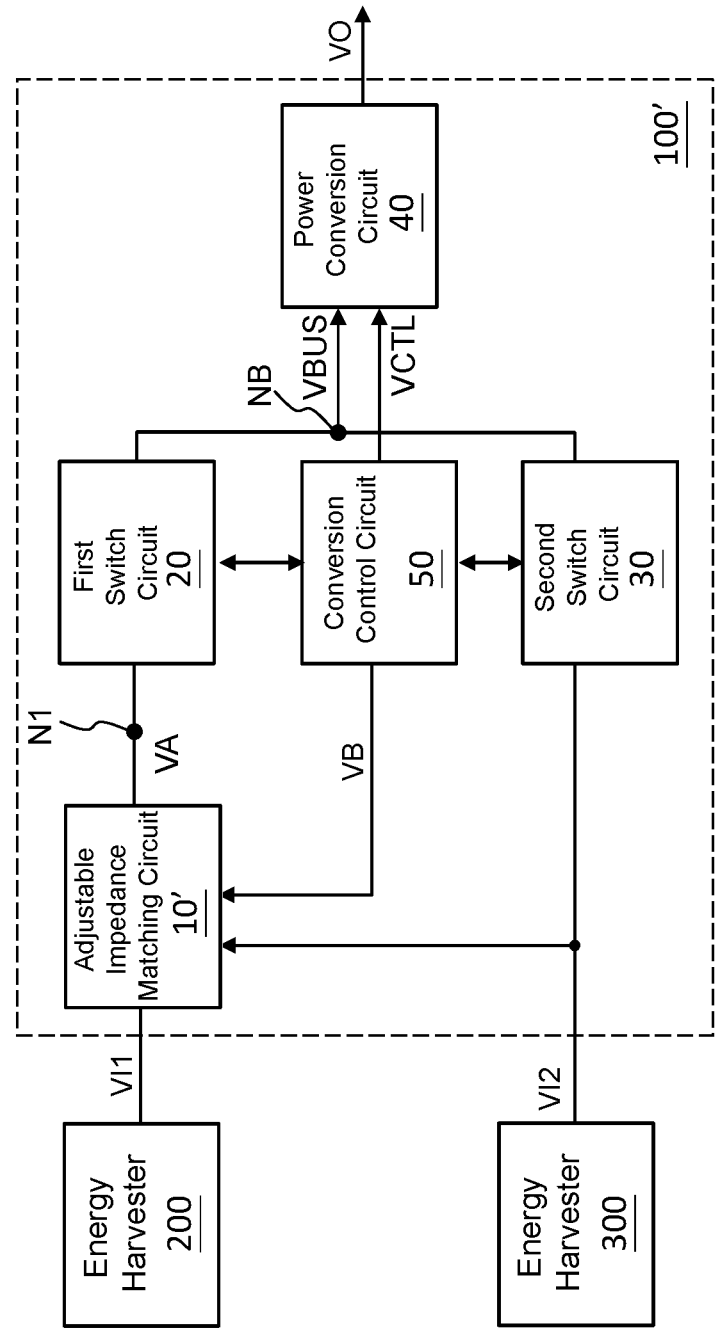
FIG. 12 shows a schematic block diagram of another multi-source energy harvester system and another power conversion apparatus according to an embodiment of the present invention.

Please refer to FIG. 12, which shows another schematic block diagram of a multi-source energy harvester system and a power conversion apparatus thereof according to an embodiment of the present invention. The multi-source energy harvester system 12 and the power conversion apparatus 100' of this embodiment are similar to the multi-source energy harvester system 3A and the power conversion apparatus 100 of the embodiment shown in FIG. 3A, but is different in that: in the power conversion apparatus 100' of this embodiment, the second input power VI2 is further coupled to the adjustable impedance matching circuit 10', to control an impedance of the adjustable impedance matching circuit 10', to maximize the voltage of the adjusted power VA. To be more specific, in this embodiment, the adjustable impedance matching circuit 10' can further adjust the impedance of the adjustable impedance matching circuit 10' according to the voltage of the second input power VI2.

Please still refer to FIG. 12. The multi-source energy harvester system 12 of this embodiment has an advantage in that: under a situation where the first energy and the second energy are inadequate, the multi-source energy harvester system 12 can still operate to supply power to a next-stage circuit (e.g., a battery cell, etc.). For example, in this embodiment, the first energy and the second energy are wireless radio frequency energy and photovoltaic energy, respectively, and the first energy harvester 200 and the second energy harvester are a corresponding radio frequency antenna and a corresponding photovoltaic cell, respectively. Under a situation where wireless radio frequency energy is inadequate, the first energy harvester 200 may not be able to supply sufficient voltage to the conversion control circuit 50. Consequently and undesirably, the conversion control circuit 50 may not be able to generate an impedance control signal VB having an adequate level. As a result, it may not be possible to control the impedance of the adjustable impedance matching circuit 10' to maximize the voltage of the adjusted power VA.

This embodiment can cope with this problem by supplying an adequate bias voltage to the adjustable impedance matching circuit 10' by the second input power VI2 (e.g., by supplying a voltage of the second input power VI2), so that the impedance of the adjustable impedance matching circuit 10' can be well controlled to raise (preferably, to maximize) the voltage of the adjusted power VA. After the voltage of the adjusted power VA has been raised to an adequate level, the conversion control circuit 50 will be able to generate an impedance control signal VB having an adequate level, whereby the impedance of the adjustable impedance matching circuit 10' can be properly controlled to maximize the voltage of the adjusted power VA, thereby fulfilling all the desired functions. In this embodiment, the level of the voltage of the second input power VI2 may not be very high but can still be sufficient to provide an adequate bias voltage to the adjustable impedance matching circuit 10', so that the impedance of the adjustable impedance matching circuit 10' can be properly controlled to raise the voltage of the adjusted power VA. In one embodiment, as a bias voltage to be supplied to the adjustable impedance matching circuit 10', the level of the voltage of the second input power VI2 can be smaller than 1V. In one embodiment, the level of the voltage of the second input power VI2 can be smaller than 0.5V.

Figure 13:
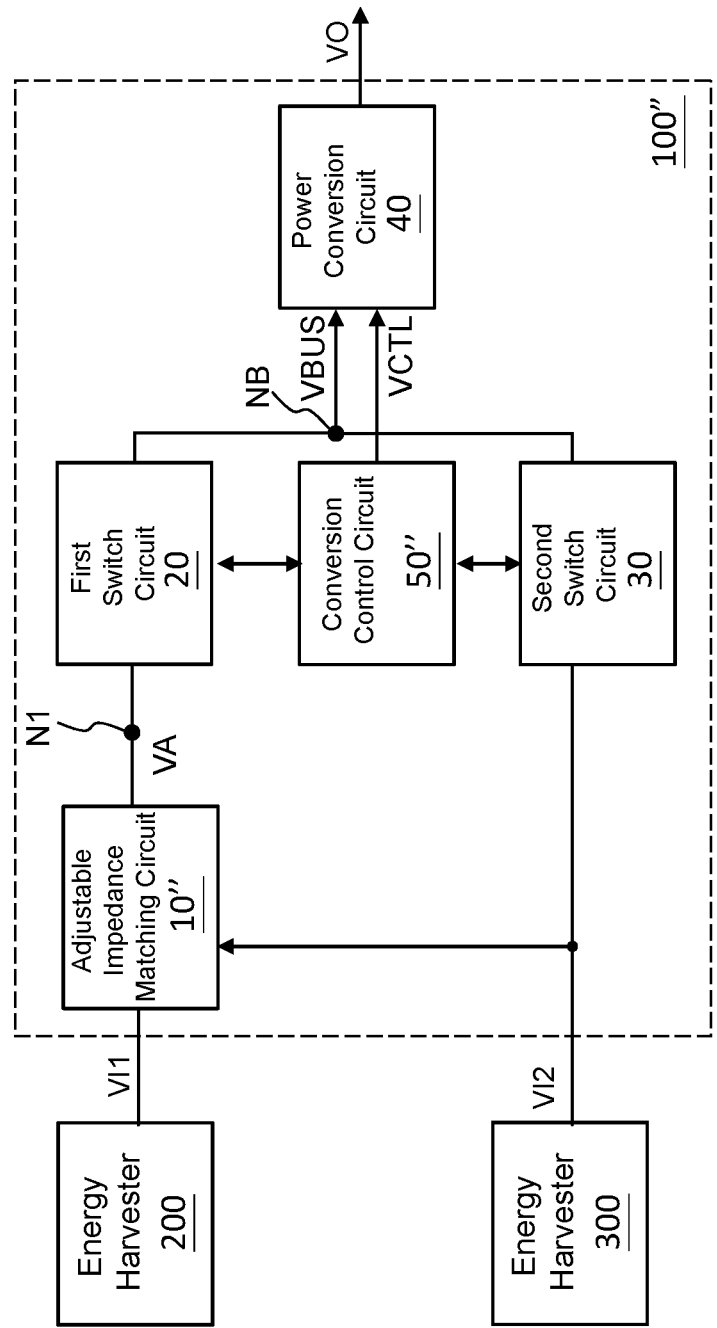
FIG. 13 shows a schematic block diagram of another multi-source energy harvester system and another power conversion apparatus according to an embodiment of the present invention.

Please refer to FIG. 13, which shows still another schematic block diagram of a multi-source energy harvester system and a power conversion apparatus thereof according to an embodiment of the present invention. The power conversion apparatus 100" of this embodiment is similar to the power conversion apparatus 100' of the embodiment shown in FIG. 12, but is different in that: in the power conversion apparatus 100" of this embodiment, the adjustable impedance matching circuit 10" is not controlled by the impedance control signal VB; instead, the impedance of the adjustable impedance matching circuit 10" is controlled by the second input power VI2. In other words, in this embodiment, the impedance control signal VB and the circuit for generating the impedance control signal VB are omitted in the conversion control circuit 50". Besides that, the conversion control circuit 50" of this embodiment operates according to substantially the same mechanism as the conversion control circuit 50 of the above-mentioned embodiments (e.g., the conversion control circuit 50 of the embodiment shown in FIG. 3A), so it has substantially the same advantages and efficacies as the conversion control circuit 50, which are not redundantly repeated here.

Figure 14:
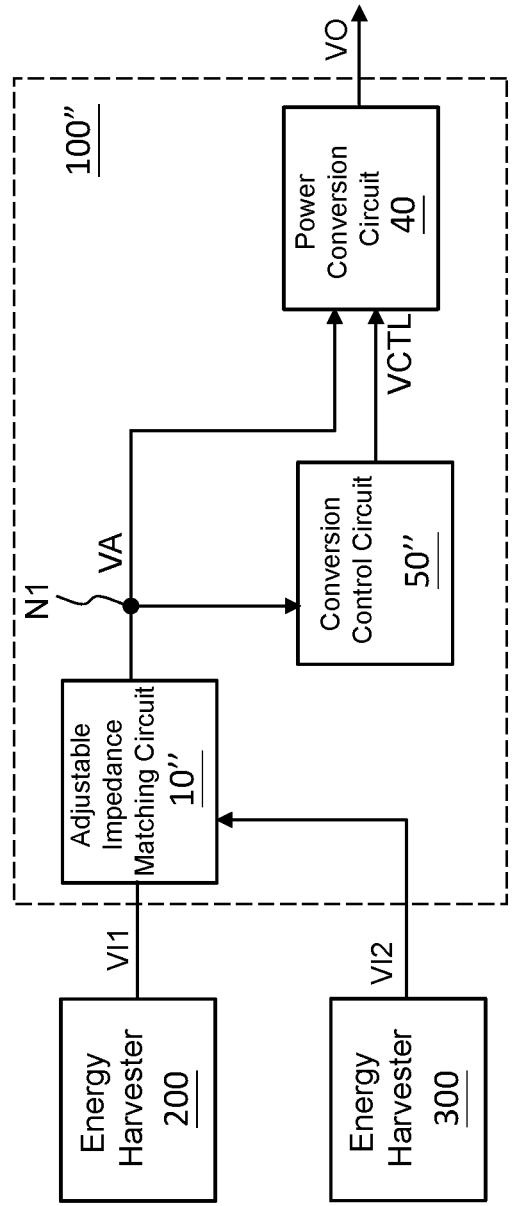
FIG. 14 shows a schematic block diagram of another multi-source energy harvester system and another power conversion apparatus according to an embodiment of the present invention.

Please refer to FIG. 14, which shows still another schematic block diagram of a multi-source energy harvester system and a power conversion apparatus thereof according to an embodiment of the present invention. The power conversion apparatus 100" of this embodiment is similar to the power conversion apparatus 100" of the embodiment shown in FIG. 13, but is different in that: in the power conversion apparatus 100" of this embodiment, the first switch circuit and the second switch circuit can be omitted. To be more specific, in the power conversion apparatus 100" of this embodiment, the first energy harvester 200 and the second energy harvester 300 can harvest a first energy and a second energy, to provide a first input power VI1 and a second input power VI2, respectively. (For the details of the first energy harvester 200 and the second energy harvester 300 and their respective corresponding first energy and second energy, please refer to the above-mentioned description corresponding to the embodiment shown in FIG. 3A, which are not redundantly repeated here.) In this embodiment, the power conversion apparatus 100" comprises an adjustable impedance matching circuit 10", a conversion control circuit 50" and a power conversion circuit 40.

The embodiments shown in FIG. 13 and FIG. 14 are similar to the embodiment shown in FIG. 12 in that the second input power VI2 supplies an adequate bias voltage (e.g., a voltage of the second input power VI2) to the adjustable impedance matching circuit 10", so that the impedance of the adjustable impedance matching circuit 10" can be well controlled to raise (preferably, to maximize) the voltage of the adjusted power VA.

Please still refer to FIG. 14. The adjustable impedance matching circuit 10" can generate an adjusted power VA at a first node N1 according to the first input power VI1. The second input power VI2 can control the impedance of the adjustable impedance matching circuit 10", to maximize the voltage of the adjusted power VA. The power conversion circuit 40 is configured to operably generate an output power VO according to the adjusted power VA. In one embodiment, the power conversion circuit 40 is configured to operably convert the adjusted power VA to generate the output power VO. The conversion control circuit 50" is configured to operably generate a conversion control signal VCTL, to control the power conversion circuit 40, so that the adjusted power VA is controlled to be substantially at its corresponding maximum power point. When the adjusted power VA is controlled to be substantially at its corresponding maximum power point, it generally indicates that the first input power VI1 is also controlled to be substantially at its corresponding maximum power point.

Figure 15:
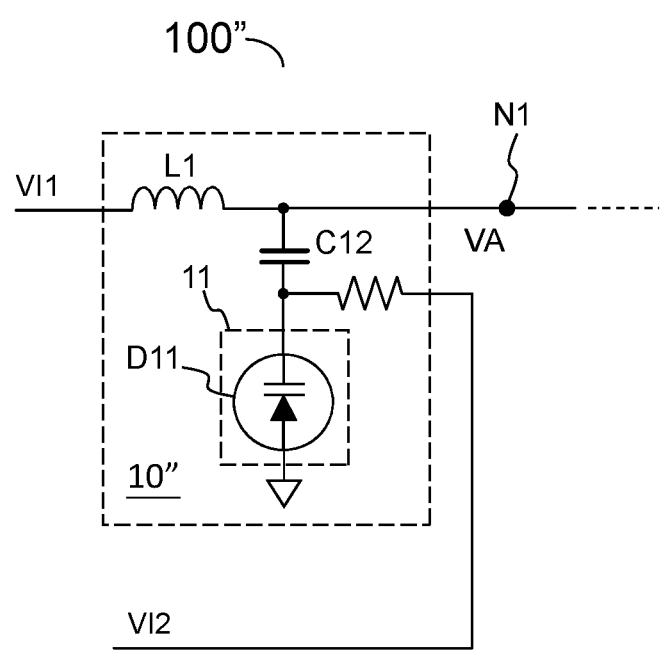
FIG. 15 shows another embodiment of an adjustable impedance matching circuit of a power conversion apparatus of the present invention.

Please refer to FIG. 15, which shows another embodiment of an adjustable impedance matching circuit of a power conversion apparatus of the present invention. The power conversion apparatus 100" and the adjustable impedance matching circuit 10" shown in FIG. 15 correspond to the power conversion apparatus 100" and the adjustable impedance matching circuit 10" shown in FIG. 13 and FIG. 14. In this embodiment shown in FIG. 15, the variable capacitor 11 of the adjustable impedance matching circuit 10" has an adjustable capacitance which can be adjusted in an analog and continuous manner according to the second input power VI2, whereby the impedance of the adjustable impedance matching circuit 10" is adjusted in an analog and continuous manner. In a specific embodiment, the capacitance of the variable capacitor 11 is adjusted in an analog and continuous manner according to the second input power VI2.

Figure 16:
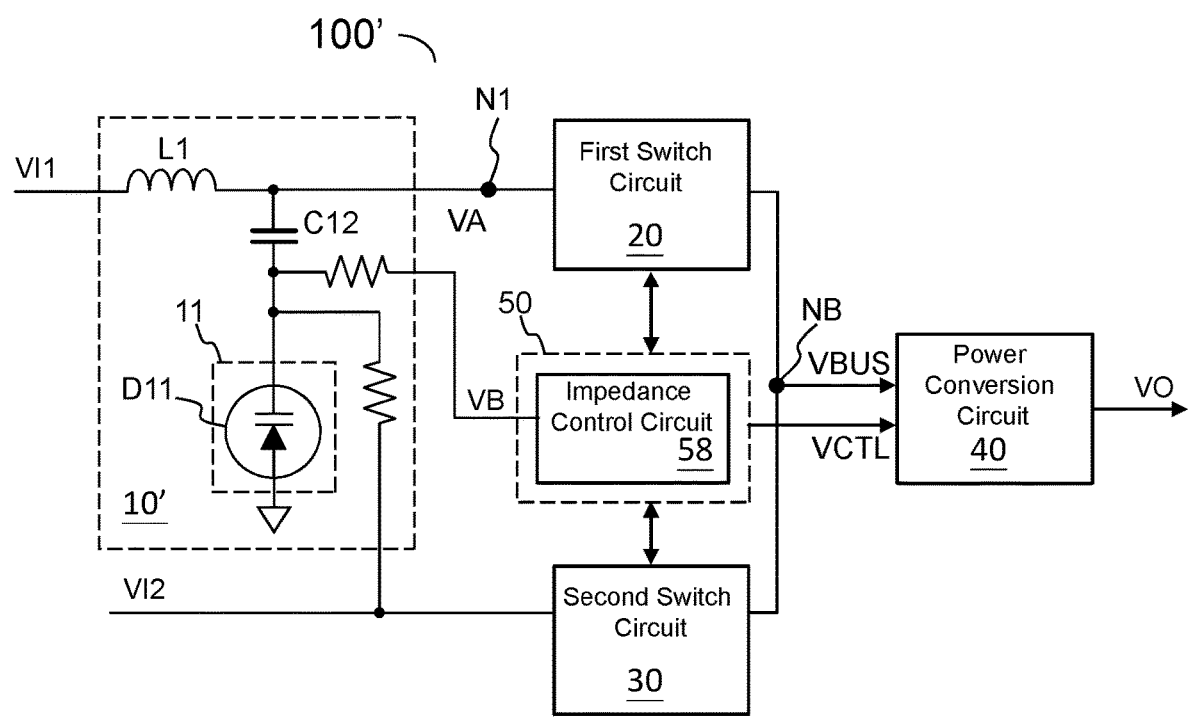
FIG. 16 shows another embodiment of an adjustable impedance matching circuit of a power conversion apparatus of the present invention.

Please refer to FIG. 16, which shows still another embodiment of an adjustable impedance matching circuit of a power conversion apparatus of the present invention. The power conversion apparatus 100' and the adjustable impedance matching circuit 10' shown in FIG. 16 correspond to the power conversion apparatus 100' and the adjustable impedance matching circuit 10' shown in FIG. 12. In this embodiment shown in FIG. 16, the variable capacitor 11 of the adjustable impedance matching circuit 10' has an adjustable capacitance which can be adjusted in an analog and continuous manner according to the impedance control signal VB and/or the second input power VI2, whereby the impedance of the adjustable impedance matching circuit 10" is adjusted in an analog and continuous manner. In a specific embodiment, the capacitance of the variable capacitor 11 is adjusted in an analog and continuous manner according to the second input power VI2.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described herein before to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A power conversion apparatus for cooperating with a first energy harvester which harvests a first energy and provides a first input power, and cooperating with a second energy harvester which harvests a second energy and provides a second input power; the power conversion apparatus comprising:
   an adjustable impedance matching circuit, which is configured to operably generate an adjusted power at a first node according to the first input power;
   a first switch circuit coupled between the first node and a bus node;
   a second switch circuit coupled between the second input power and the bus node;
   a conversion control circuit, which is configured to operably control the first switch circuit and the second switch circuit according to a voltage of the adjusted power and/or a voltage of the second input power, to select and conduct one of the adjusted power or the second input power to generate the bus power at the bus node, wherein the conversion control circuit is configured to operably generate an impedance control signal for adjusting an impedance of the adjustable impedance matching circuit to maximize the voltage of the adjusted power; and
   a power conversion circuit, which is configured to operably convert the bus power to an output power.

2. The power conversion apparatus of claim 1, wherein the conversion control circuit generates the bus power according to one of the following ways:
   (1) comparing the voltage of the adjusted power with the voltage of the second input power, to select one of the adjusted power and the second input power, which has a higher voltage than the other, as the bus power; or
   (2) comparing the voltage of the second input power with a first predetermined voltage, and when the voltage of the second input power is higher than the first predetermined voltage, selecting and conducting the second input power as the bus power.

3. The power conversion apparatus of claim 1, wherein the conversion control circuit generates a conversion control signal according to a first sensing signal, to control the power conversion circuit, so that the first input power or the second input power is controlled to be substantially at its respective corresponding maximum power point; wherein the first sensing signal is related to at least one of the followings:
   (1) the voltage of the adjusted power;
   (2) the voltage of the second input power; or
   (3) a voltage of the bus power.

4. The power conversion apparatus of claim 3, wherein the conversion control circuit controls a level of the output power generated from the power conversion circuit, so that the first sensing signal is not lower than a second predetermined voltage, wherein the second predetermined voltage is related to a maximum power point corresponding to the first input power or a maximum power point corresponding to the second input power.

5. The power conversion apparatus of claim 4, wherein the conversion control circuit includes:
   a sample-and-hold circuit, which is configured to operably, under a situation where the adjusted power is selected as the bus power, sample and hold a divided voltage of an open circuit voltage of the adjusted power, as the second predetermined voltage; or, wherein the sample-and-hold circuit is configured to operably, under a situation where the second input power is selected as the bus power, sample and hold a divided voltage of an open circuit voltage of the second input power, as the second predetermined voltage.

6. The power conversion apparatus of claim 1, wherein the first input power is in a form of AC power; wherein the power conversion apparatus further includes a rectifier circuit which includes at least one rectifying device, and wherein the rectifier circuit is arranged by one of the following ways:
   (1) the rectifying device is coupled between an output terminal of the adjustable impedance matching circuit and the first node, wherein the rectifying device is configured to operably rectify an output signal of the adjustable impedance matching circuit, to generate the adjusted power at the first node; or
   (2) the rectifying device is coupled between an output terminal of the adjustable impedance matching circuit and the bus node, wherein the rectifying device is configured to operably rectify the adjusted power, to generate the adjusted power at the bus node;
   wherein the first switch circuit includes the rectifying device, the rectifying device being configured to operably control whether to conduct the adjusted power as the bus power.

7. The power conversion apparatus of claim 6, wherein the rectifying device is a rectifying diode.

8. The power conversion apparatus of claim 1, wherein the adjustable impedance matching circuit includes a variable capacitor having a capacitance which is adjustable in an analog and continuous manner according to the impedance control signal, whereby the impedance of the adjustable impedance matching circuit is adjustable in an analog and continuous manner.

9. The power conversion apparatus of claim 2, wherein the second switch circuit includes a path switch, which is configured to operably control a conduction path between the second input power and the bus power, and wherein the conversion control circuit includes a first comparison circuit, which is configured to operably compare the voltage of the second input power with the first predetermined voltage to generate a first comparison result, the conversion control circuit being configured to operably control whether the path switch conducts the second input power as the bus power according to the first comparison result.

10. The power conversion apparatus of claim 9, wherein the conversion control circuit further determines whether to enable the impedance control signal according to the first comparison result, and wherein when the voltage of the second input power is lower than the first predetermined voltage, the conversion control circuit enables the impedance control signal.

11. The power conversion apparatus of claim 3, wherein the conversion control circuit includes:
   a bias sensing circuit coupled between the bus node and a sensing node, the bias sensing circuit being configured to operably generate a second sensing signal at the sensing node according to the voltage of the bus power;
   a clamper circuit coupled to the sensing node, the clamper circuit being configured to operably clamp the second sensing signal, so that the second sensing signal is not greater than a clamping voltage; and
   a second comparison circuit, which is configured to operably generate the conversion control signal according to a difference between the second sensing signal and a third predetermined voltage.

12. The power conversion apparatus of claim 11, wherein the bias sensing circuit includes:
   a bias resistor, which is configured to operably provide a bias current; and
   a sensing capacitor, wherein the sensing capacitor and the bias resistor are coupled to each other in parallel between the bus power and the sensing node.

13. The power conversion apparatus of claim 12, wherein the bias resistor is a parasitic resistor of the sensing capacitor.

14. The power conversion apparatus of claim 11, wherein the clamper circuit includes a clamping diode, and wherein the clamping voltage is related to a forward voltage of the clamping diode.

15. The power conversion apparatus of claim 11, wherein the conversion control circuit further generates the impedance control signal according to the conversion control signal.

16. The power conversion apparatus of claim 2, wherein the conversion control circuit periodically selects and conducts one of the adjusted power or the second input power as the bus power according to a comparison result between the voltage of the adjusted power and the voltage of the second input power or a comparison result between the voltage of the second input power and the first predetermined voltage.

17. The power conversion apparatus of claim 11, wherein the power conversion circuit is selected from one of the followings:
   (1) a boost switching regulator;
   (2) a buck switching regulator;
   (3) a buck-boost switching regulator;
   (4) a low-dropout linear regulator (LDO); or
   (5) a charger circuit.

18. The power conversion apparatus of claim 1, wherein the second input power is further coupled to the adjustable impedance matching circuit for controlling the impedance of the adjustable impedance matching circuit to raise the voltage of the adjusted power.

19. A multi-source energy harvester system, comprising:
   a first energy harvester configured to operably harvest a first energy and provide a first input power;
   a second energy harvester configured to operably harvest a second energy and provide a second input power; and
   a power conversion apparatus including:
      an adjustable impedance matching circuit, which is configured to operably generate an adjusted power at a first node according to the first input power;
      a first switch circuit coupled between the first node and a bus node;
      a second switch circuit coupled between the second input power and the bus node;
      a conversion control circuit, which is configured to operably control the first switch circuit and the second switch circuit according to a voltage of the adjusted power and/or a voltage of the second input power, to select and conduct one of the adjusted power or the second input power to generate the bus power at the bus node, wherein the conversion control circuit is configured to operably generate an impedance control signal for adjusting an impedance of the adjustable impedance matching circuit to maximize the voltage of the adjusted power; and
      a power conversion circuit, which is configured to operably convert the bus power to an output power.

20. A method for controlling a multi-source energy harvester system, wherein the multi-source energy harvester system comprises a power conversion apparatus, a first energy harvester and a second energy harvester, wherein the first energy harvester is configured to operably harvest a first energy and provide a first input power, and the second energy harvester is configured to operably harvest a second energy and provide a second input power; the power conversion apparatus including: an adjustable impedance matching circuit, which is configured to operably generate an adjusted power at a first node according to the first input power; a first switch circuit coupled between the first node and a bus node; a second switch circuit coupled between the second input power and the bus node; and a power conversion circuit, which is configured to operably convert a bus power to an output power; the method comprising:
   controlling the first switch circuit and the second switch circuit according to a voltage of the adjusted power and/or a voltage of the second input power, to select and conduct one of the adjusted power or the second input power to generate the bus power at the bus node; and
   adjusting an impedance of the adjustable impedance matching circuit, to maximize the voltage of the adjusted power.

21. The method of claim 20, wherein the step for generating the bus power includes one of the following ways:
   (1) comparing the voltage of the adjusted power with the voltage of the second input power, to select one of the adjusted power and the second input power, which has a higher voltage than the other, as the bus power; or
   (2) comparing the voltage of the second input power with a first predetermined voltage, and when the voltage of the second input power is higher than the first predetermined voltage, selecting and conducting the second input power as the bus power.

22. The method of claim 20, further comprising:
   controlling the power conversion circuit according to a first sensing signal, so that the first input power or the second input power is controlled to be substantially at its respective corresponding maximum power point; wherein the first sensing signal is related to at least one of the followings:
   (1) the voltage of the adjusted power;
   (2) the voltage of the second input power; or
   (3) a voltage of the bus power.

23. The method of claim 20, wherein the step for controlling the power conversion circuit includes:
   controlling a level of the output power generated from the power conversion circuit, so that the first sensing signal is not lower than a second predetermined voltage, wherein the second predetermined voltage is related to a maximum power point corresponding to the first input power or a maximum power point corresponding to the second input power.

24. The method of claim 20, wherein the second input power is further configured to operably control the impedance of the adjustable impedance matching circuit, so as to raise the voltage of the adjusted power.

25. A power conversion apparatus for cooperating with a first energy harvester which harvests a first energy and provides a first input power, and cooperating with a second energy harvester which harvests a second energy and provides a second input power; the power conversion apparatus comprising:
   an adjustable impedance matching circuit, which is configured to operably generate an adjusted power at a first node according to the first input power, wherein the second input power controls an impedance of the adjustable impedance matching circuit, to maximize the voltage of the adjusted power;

a power conversion circuit, which is configured to operably generate an output power according to the adjusted power; and a conversion control circuit, which is configured to operably generate a conversion control signal for controlling the power conversion circuit, so that the adjusted power is controlled to be substantially at a corresponding maximum power point.

26. The power conversion apparatus of claim 25, wherein the first energy harvester is a radio frequency antenna or an electromagnetic induction apparatus, the first energy being wireless radio frequency energy, the first input power being in a form of AC power, and wherein the second energy harvester is a photovoltaic cell, which is configured to operably harvest photovoltaic energy.

27. The power conversion apparatus of claim 25, further comprising:

a first switch circuit coupled between the first node and a bus node; and a second switch circuit coupled between the second input power and the bus node;

wherein the conversion control circuit is configured to operably control the first switch circuit and the second switch circuit according to a voltage of the adjusted power and/or a voltage of the second input power, to select and conduct one of the adjusted power or the second input power to generate the bus power at the bus node;

wherein the power conversion circuit is configured to operably convert the bus power to the output power.

28. The power conversion apparatus of claim 27, wherein the conversion control circuit further generates an impedance control signal for adjusting the impedance of the adjustable impedance matching circuit to maximize the voltage of the adjusted power.

* * * * *